US012731757B2

(12) United States Patent
Stegmann

(10) Patent No.: US 12,731,757 B2
(45) Date of Patent: Sep. 8, 2026

(54) DEVICE AND METHOD FOR PREPARING MICROSCOPIC SAMPLES VIA BACKSIDE THINNING

(71) Applicant: Carl Zeiss Microscopy GmbH, Jena (DE)

(72) Inventor: Heiko Stegmann, Dresden (DE)

(73) Assignee: Carl Zeiss Microscopy GmbH, Jena (DE)

( * ) Notice: Subject to any disclaimer, the term of this patent is extended or adjusted under 35 U.S.C. 154(b) by 316 days.

(21) Appl. No.: 18/627,819

(22) Filed: Apr. 5, 2024

(65) Prior Publication Data

US 2024/0347312 A1 Oct. 17, 2024

(30) Foreign Application Priority Data

Apr. 11, 2023 (DE) ........................ 102023109043.7

(51) Int. Cl.
*H01J 37/20* (2006.01)

(52) U.S. Cl.
CPC ..... *H01J 37/20* (2013.01); *H01J 2237/20214* (2013.01)

(58) Field of Classification Search
CPC .. H01J 37/20; H01J 37/26; H01J 37/30; H01J 2237/20214; H01J 2237/201; H01J 2237/20207; H01J 2237/31745; G01N 2001/2873; G01N 1/286; G01N 1/28
USPC .................................................... 250/442.11
See application file for complete search history.

(56) References Cited

U.S. PATENT DOCUMENTS

| | | | |
|---|---|---|---|
| 7,474,419 | B2 | 1/2009 | Tappel |
| 8,168,949 | B2 | 5/2012 | Zaykova-Feldman |
| 8,642,958 | B2 | 2/2014 | Takahashi |
| 8,674,324 | B2 | 3/2014 | Hasuda |
| 9,653,260 | B2 | 5/2017 | Keady |

(Continued)

FOREIGN PATENT DOCUMENTS

| | | | |
|---|---|---|---|
| CZ | 2019456 | A3 | 2/2020 |
| DE | 10 2013 102 658 | A1 | 9/2013 |

(Continued)

OTHER PUBLICATIONS

V. Srot et al., Preparation of High-Quality Samples for MEMS-Based In-Situ (S) TEM Experiments, Microscopy and Microanalysis 29 (2023), S. 596-605.

(Continued)

*Primary Examiner* — Kiet T Nguyen
(74) *Attorney, Agent, or Firm* — Fish & Richardson P.C.

(57) ABSTRACT

The disclosure relates to a sample holder for holding a microsample during backside thinning, and to a backside thinning method. The sample holder is mountable on a sample stage and comprises a base plate, an intermediate piece and a receiving device. The base plate has a base face. The intermediate piece is rotatably arranged on the base plate and is rotatable about a first axis of rotation R1, which is aligned relative to the base face at an angle of 45°. The receiving device is also rotatably connected to the intermediate piece. The first receiving is being rotatable relative to the intermediate piece about a second axis of rotation R2. The second axis of rotation R2 is aligned relative to the base face at an angle of (90+x)°, with x taking a value of 0 to 20.

20 Claims, 16 Drawing Sheets

(56) References Cited

U.S. PATENT DOCUMENTS

| | | | | |
|---|---|---|---|---|
| 2011/0017922 | A1* | 1/2011 | Amador | H01J 37/20 250/442.11 |
| 2015/0214004 | A1 | 7/2015 | Pavia | |
| 2020/0035444 | A1 | 1/2020 | Nicoletti et al. | |
| 2021/0050180 | A1 | 2/2021 | Denisyuk | |
| 2023/0003988 | A1* | 1/2023 | Stegmann | H01J 37/28 |

FOREIGN PATENT DOCUMENTS

| | | | |
|---|---|---|---|
| DE | 10 2018 212 511 | B4 | 2/2020 |
| DE | 10 2021 207 016 | B3 | 10/2022 |
| JP | 2020-016640 | A | 1/2020 |

OTHER PUBLICATIONS

German Office Action, with translation thereof, for corresponding DE Appl No. 10 2023 109 043.7, dated Feb. 9, 2024.

* cited by examiner 4
2
8
5
1
3

6
8
9
10
3
7

6
1.Rotation
10
8
7
9

Rv
180°
8

2.Rotation
4
7
6
rotation according to the invention
imaginary rotation about Rv
10
9
3
8
5 z
y
x z
y
x
16
R1
R2
14
15
11
12
13
20

16
11
17
12a
12
R1
R2
12c
21
13c
14
α2
R3
α3
15
α1
γ1
α4
19
18
12b
13a
13
13b
20
z
y
x 30
32
R1
α2'
R2
34
R3
31
35
36
37
α1'
γ1'
33
α3'
α4'

32
31
33

38
36
35
33
R2
32
z
y
x
R1
31 z
y
x
11
12
13
35

36

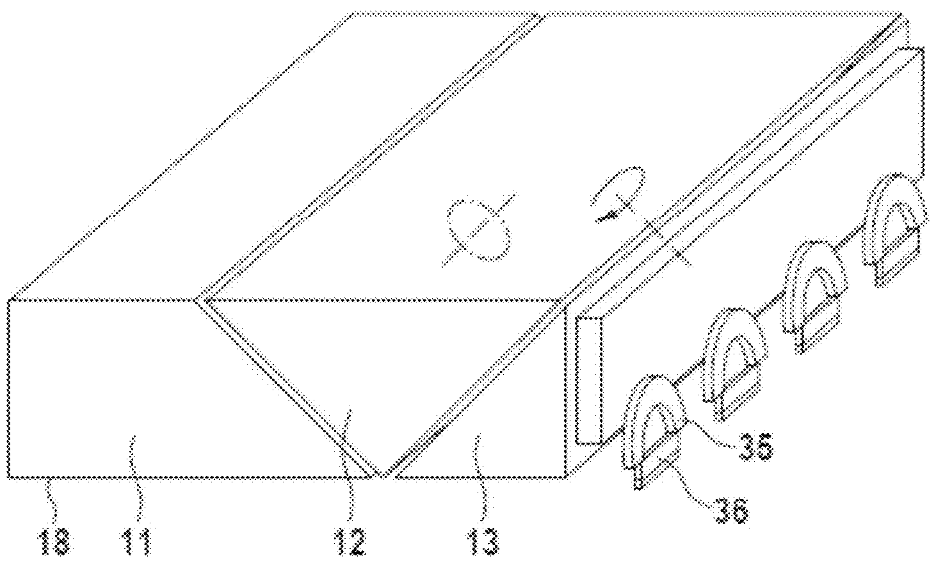
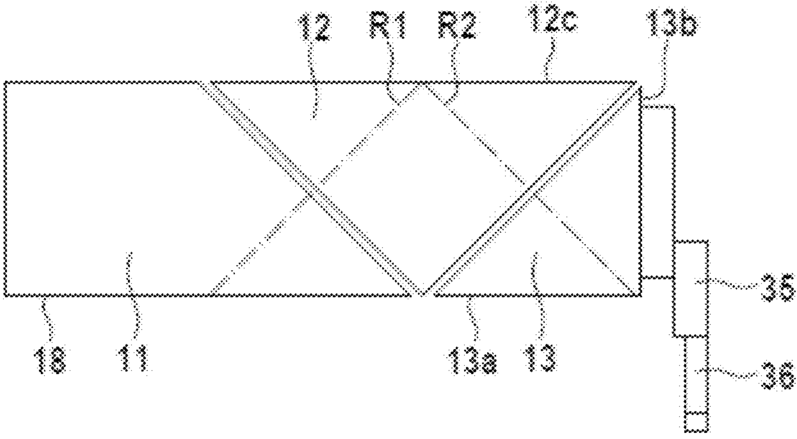
Fig. 4J

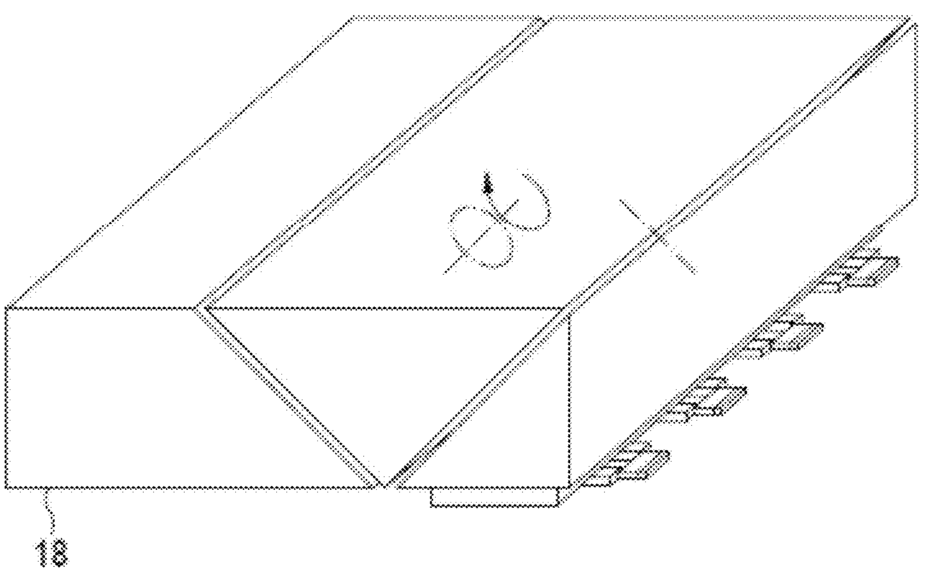
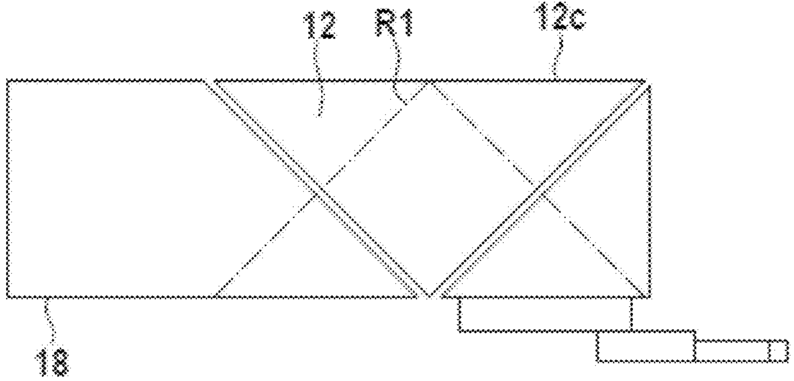
Fig. 4L

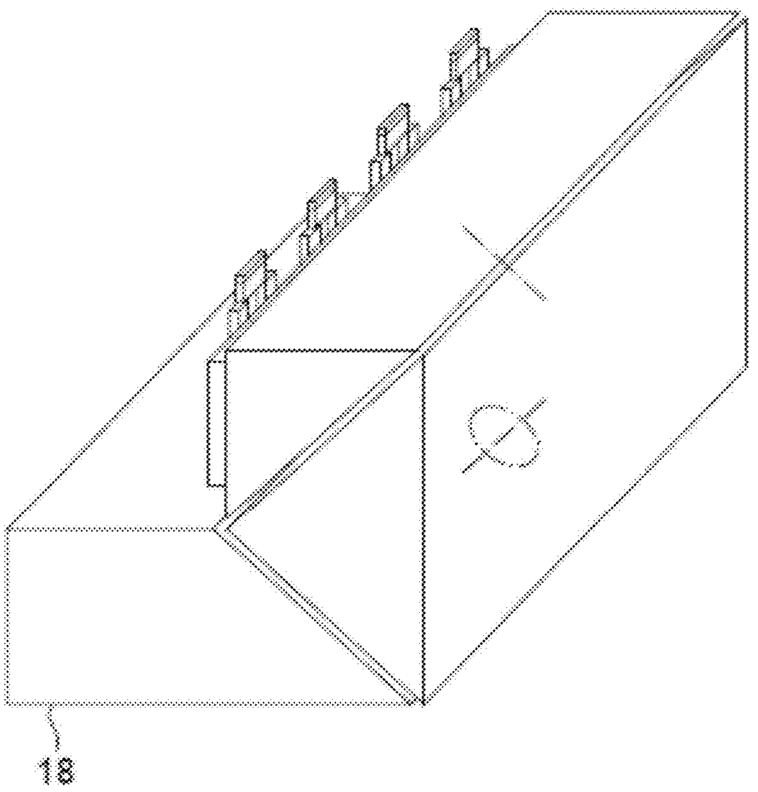
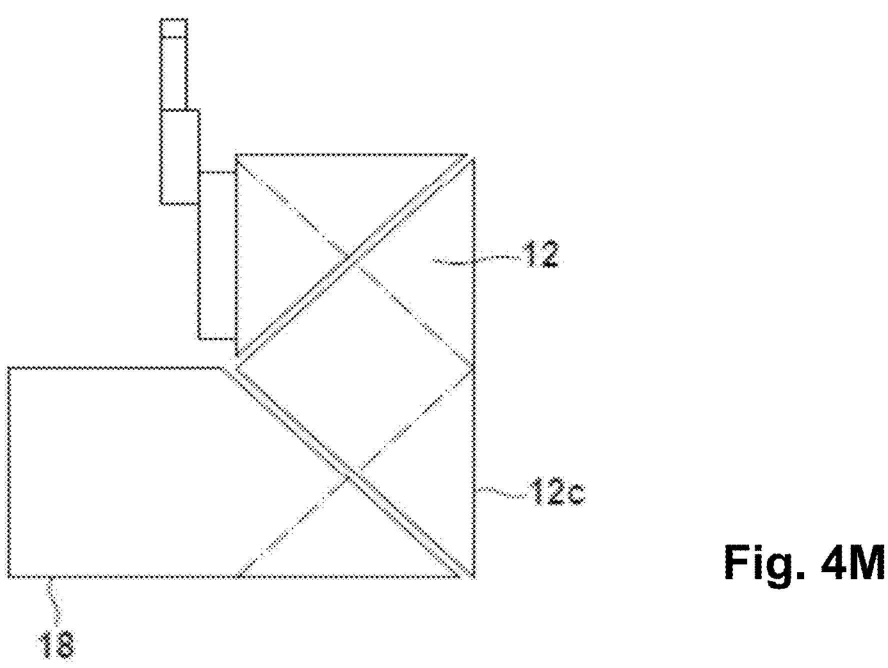
Fig. 4M

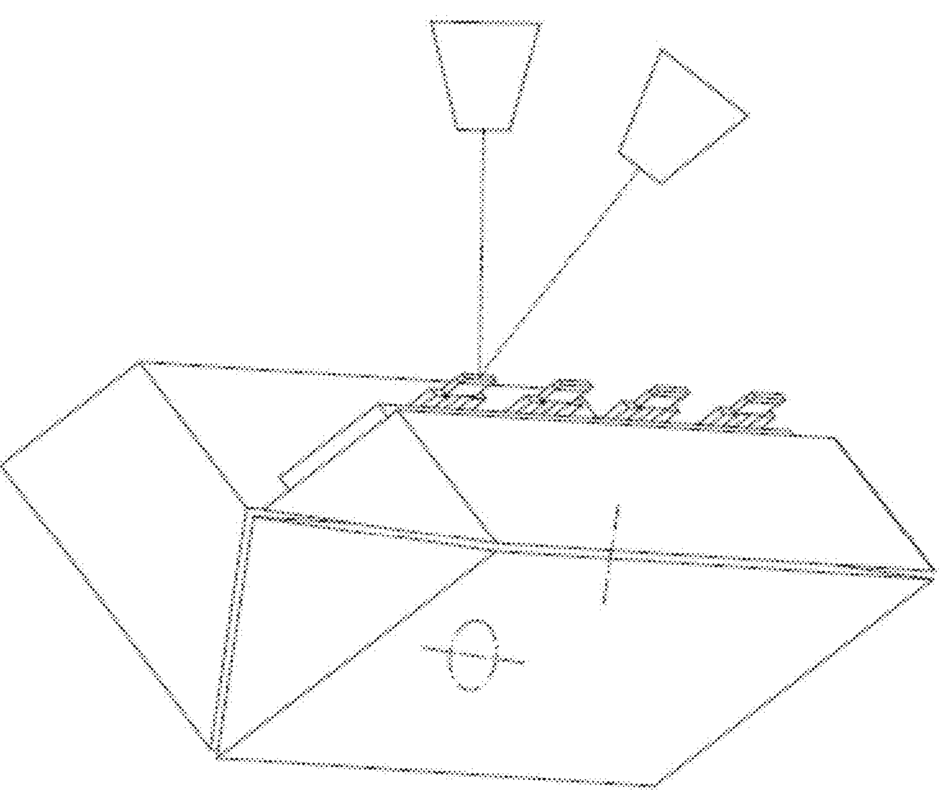
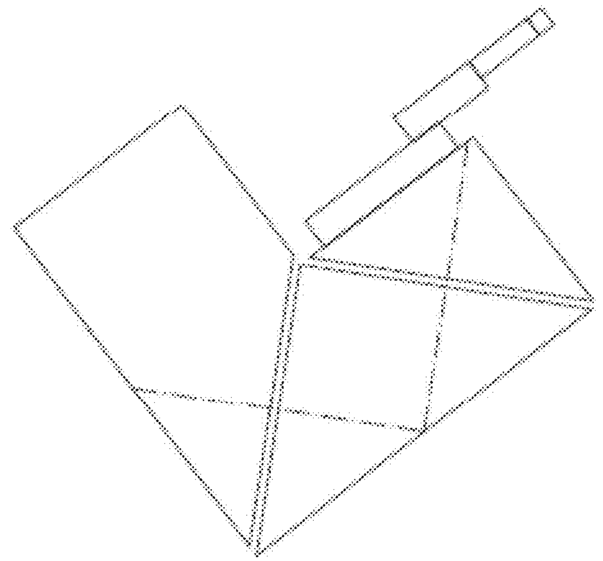
Fig. 4N

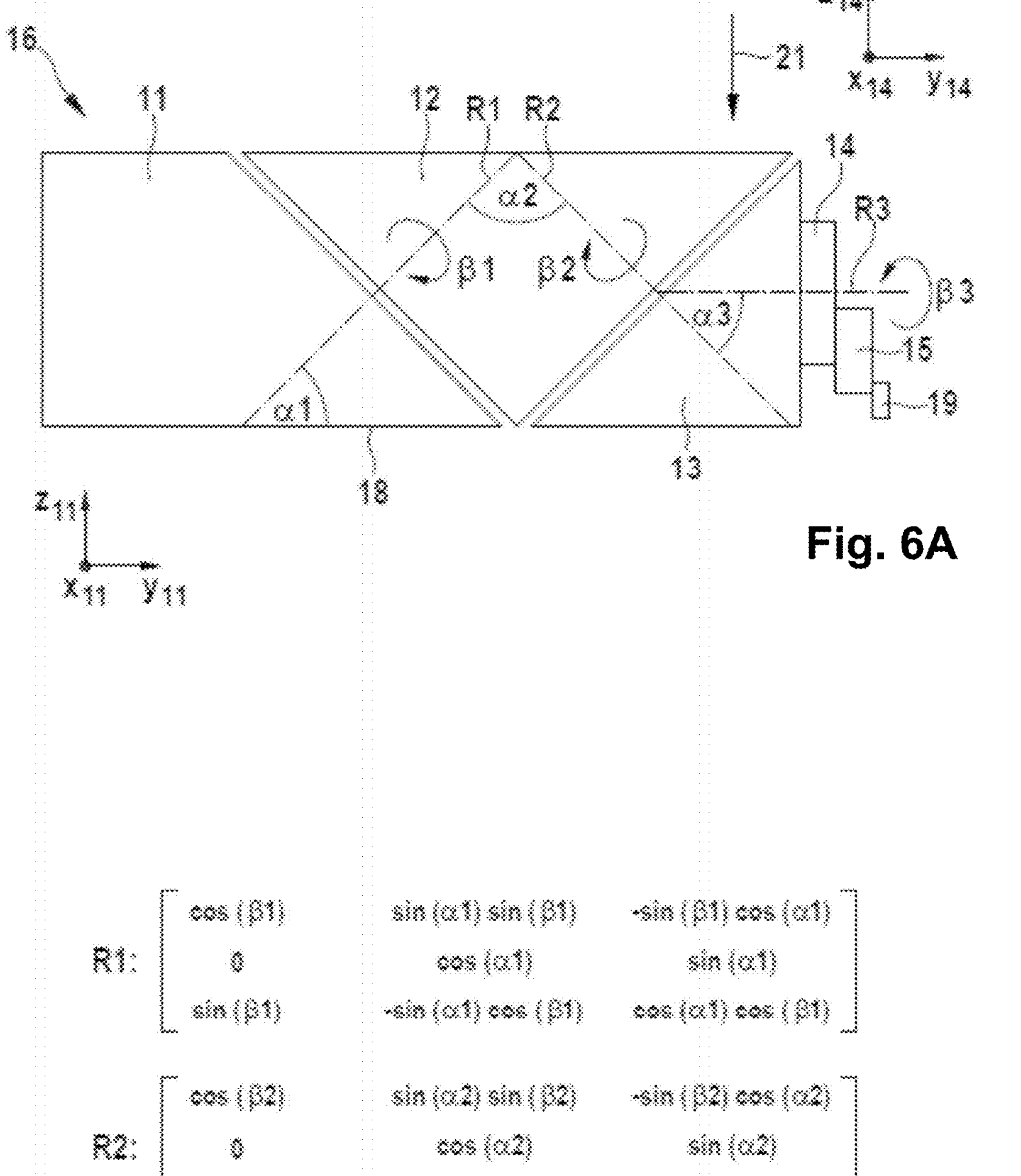

Fig. 6A $$R1: \begin{bmatrix} \cos(\beta 1) & \sin(\alpha 1)\sin(\beta 1) & -\sin(\beta 1)\cos(\alpha 1) \\ 0 & \cos(\alpha 1) & \sin(\alpha 1) \\ \sin(\beta 1) & -\sin(\alpha 1)\cos(\beta 1) & \cos(\alpha 1)\cos(\beta 1) \end{bmatrix}$$

$$R2: \begin{bmatrix} \cos(\beta 2) & \sin(\alpha 2)\sin(\beta 2) & -\sin(\beta 2)\cos(\alpha 2) \\ 0 & \cos(\alpha 2) & \sin(\alpha 2) \\ \sin(\beta 2) & -\sin(\alpha 2)\cos(\beta 2) & \cos(\alpha 2)\cos(\beta 2) \end{bmatrix}$$

$$R3: \begin{bmatrix} \cos(\beta 3) & \sin(\alpha 3)\sin(\beta 3) & -\sin(\beta 3)\cos(\alpha 3) \\ 0 & \cos(\alpha 3) & \sin(\alpha 3) \\ \sin(\beta 3) & -\sin(\alpha 3)\cos(\beta 3) & \cos(\alpha 3)\cos(\beta 3) \end{bmatrix}$$

Fig. 6B

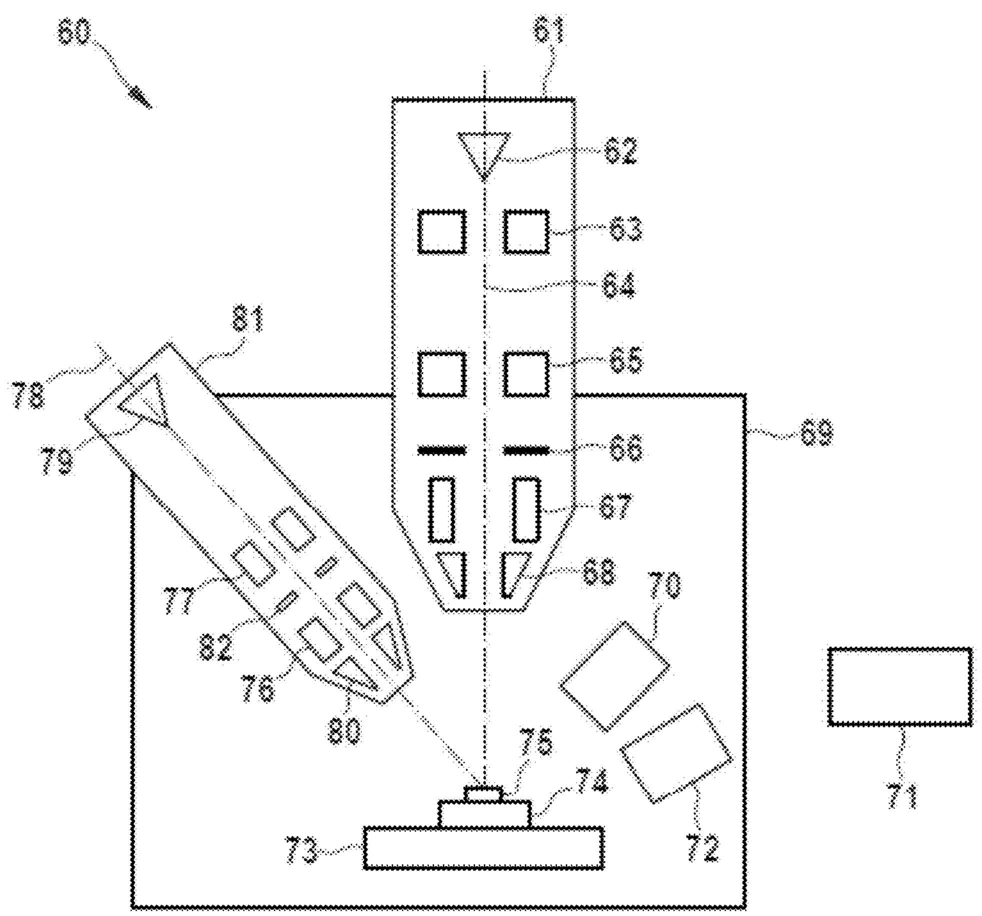
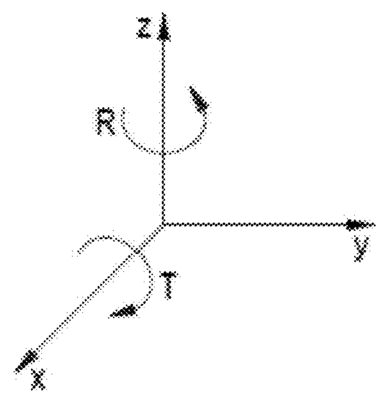
Fig. 8

DEVICE AND METHOD FOR PREPARING MICROSCOPIC SAMPLES VIA BACKSIDE THINNING

CROSS-REFERENCE TO RELATED APPLICATION

This application claims benefit under 35 U.S.C. § 119 to German Application No. 10 2023 109 043.7, filed Apr. 11, 2023. The entire disclosure of this application is incorporated by reference herein.

FIELD

The disclosure relates to devices and methods for preparing microscopic samples, for example TEM lamellae, for example, via backside thinning. A sample holder can provide an additional degree of freedom of movement, so that the spatial orientation of a microsample (also referred to as microscopic sample or abbreviated to sample) held on this sample holder can be changed in a defined way. This can help make it possible to facilitate and speed up the thinning of the sample via backside thinning.

BACKGROUND

Thinning of the sample by backside thinning is used, for example, in the production of TEM lamellae. A TEM lamella is understood to mean an electron-microscopic sample which has the shape of a very flat cuboid. The cuboid can be so thin in at least one region that electrons can pass therethrough. Electrons that have passed through the TEM lamella (referred to as transmitted electrons) can then be detected by a suitable detector and used to generate an image of the sample (referred to as transmission image).

The TEM lamella can be produced using a focused ion beam (FIB) as cross-sectional lamella (cross section). This means that the lamella can be cut out of a sample block perpendicularly in relation to the sample surface. Then, the TEM lamella can be removed from the sample block (what is referred to as lift out) by a micromanipulator and thinned until it is transparent to electrons.

A focused ion beam, which is aligned parallel or approximately parallel to the areal extent of the lamella, that is to say has a grazing orientation relative to the face of the lamella, is usually also used to thin the microsample. Depending on how the lamella is aligned relative to the incident ion beam, a distinction can be made between frontside thinning and backside thinning.

If the ion beam is incident on that lamella edge that corresponds to the sample surface in the original position in the sample block, reference is made to frontside thinning. For this type of sample thinning, the spatial orientation of the TEM lamella is not be changed.

However, if the ion beam is incident on the lamella edge that was originally concealed inside the sample block, reference is made to backside thinning. For backside thinning, the TEM lamella can be rotated such that the side that faced toward the ion beam prior to the cutting out from the sample block (that is to say, the original sample surface) then faces away from the incident ion beam.

It is often only possible to thin the TEM lamella uniformly and without artefacts if that part of the TEM lamella that faces toward the FIB during the thinning operation is formed of a homogeneous material. If, however, the lamella part is supplied as heterogeneous, what are referred to as curtaining artefacts can occur, and these are undesirable.

This is generally the case for samples in the semiconductor field. Semiconductor samples usually have specific structures or intrinsic material differences which can cause curtaining artefacts or can facilitate their generation. For example, in the production of semiconductor components, often vertical and horizontal functional structures are built up from various materials on a homogeneous substrate (e.g. silicon or gallium arsenide).

Since the spatial orientation of the TEM lamella is usually not changed when the TEM lamella is conventionally thinned by frontside thinning, the ion beam is incident on these functional structures first. Therefore, a non-uniform material composition runs the risk of considerable curtaining effects.

By contrast, in the case of backside thinning, the ion beam is incident from the side of the substrate, so that the curtaining on the functional structures is strongly suppressed. It is often possible to also achieve a smaller thickness of the TEM lamella with backside thinning than with frontside thinning.

Backside thinning is therefore, in general, the method of choice for the production of high-quality TEM lamellae for electron microscopy examination of semiconductor structures in transmission. Backside thinning methods are therefore, in general, of greater and ever-increasing relevance in the development and monitoring of production processes in the semiconductor industry.

A sample receiving device having what is referred to as a flip axis, so that a received sample can be rotated, is known (U.S. Pat. No. 7,474,419B2). A specially designed sample holder with a flip axis is used for this.

A sample receiving device which can perform a 90° tilt has also been described (DE10 2018 212 511 B4). In this case, the lamella can be brought into the desired spatial orientation for the backside thinning by combining rotations of the sample stage, of the micromanipulator and of the TEM grid. A special sample holder and a micromanipulator are desirable.

Another described method (US20210050180A1) utilizes a micromanipulator of which the longitudinal axis is aligned approximately parallel to the XY plane of the sample stage and perpendicularly in relation to the tilt axis of the sample stage. After removal, the lamella is rotated on its own by rotation of the micromanipulator by 180° and then fastened to the TEM grid. A relatively cost-intensive micromanipulator which is able to rotate is used.

U.S. Pat. No. 9,653,260 B2 discloses a further method for TEM sample preparation. In this case, the spatial orientation of the sample is changed by combining tilting movements of the sample holder and rotational movements of the micromanipulator needle. A Amicromanipulator with a rotatable needle is involved.

REFERENCES INCLUDE

U.S. Pat. No. 7,474,419B2 (Tappel et al.)
DE 10 2018 212 511 B4 (Nicoletti & Biberger)
US20210050180A1 (Denisyuk et al.)
U.S. Pat. No. 9,653,260 B2 (Keady et al.)

SUMMARY

It is desirable to make available a sample holder which makes it possible to bring about the desired change in spatial orientation of an extracted TEM lamella (or a different type of microscopic sample) without involving further auxiliaries, such as a micromanipulator with an axis of rotation.

Such a proposed sample holder may make it possible to rotate the microsample without needing to repeatedly transfer the microsample from a micromanipulator to the sample holder.

It is also desirable to have available a method for changing the spatial orientation of the microsample that makes it possible to straightforwardly and quickly provide the microsample for backside thinning.

The present disclosure proposes a sample holder for backside thinning.

The present disclosure also proposes a method which makes it possible to change the spatial orientation of a microsample taken from a sample block during the sample preparation in such a way that the microsample can be subjected to backside thinning.

Spatial orientation is understood to mean the alignment of the microsample in three-dimensional space. The spatial orientation is usually specified in relation to the optical axes of the microscope system used to prepare the sample.

In an aspect, the disclosure provides a sample holder for receiving a microsample. The sample holder is mountable on a sample stage of a microscope system. The microscope system has at least one optical axis. The sample holder comprises a base plate, an intermediate piece and a first receiving device. The intermediate piece is arranged between the base plate and the first receiving device. The first receiving device is designed to receive the microscopic sample. The base plate has a base face. The intermediate piece is rotatably connected to the base plate so that the intermediate piece is rotatable relative to the base plate about a first axis of rotation R1. It is possible for the intermediate piece to assume a first alignment and a second alignment relative to the optical axis, and for the intermediate piece to be transferred from one alignment to the other by rotation about the first axis of rotation R1. The first axis of rotation R1 is aligned relative to the base face at an angle α1 of 45°. The first receiving device is rotatably connected to the intermediate piece. The first receiving device is rotatable relative to the intermediate piece about a second axis of rotation R2. It is possible for the receiving device to assume a first alignment and a second alignment relative to the optical axis, and for the receiving device to be transferred from one alignment to the other by rotation about the second axis of rotation R2. The second axis of rotation R2 is aligned relative to the first axis of rotation R1 at an angle α2 of (90+x)°, with x taking a value of 0 to 20.

In an aspect, the disclosure provides a method for preparing a microsample via backside thinning. The method is carried out using a microscope system which comprises an electron beam column for generating an electron beam and an ion beam column for generating a focused ion beam. The electron beam column and the ion beam column each have an optical axis and the microscope system also having a tiltable sample stage, which is rotatable about a tilt axis T. The method comprises the following steps: providing an extracted microsample, which was processed with a focused ion beam (FIB) and therefore has a side that faced toward the ion beam during the processing and is referred to as front side, and a side, situated opposite the front side, that faced away from the ion beam during the processing and is referred to as back side; providing a sample holder as disclosed herein on the sample stage, the intermediate piece of the sample holder being provided in a first alignment and the first receiving device of the sample holder being provided in a first alignment, the first receiving device providing a sample carrier for receiving the microscopic sample; moving the microsample up to the sample carrier; fastening the microsample to the sample carrier; rotating the first receiving device about the second axis of rotation R2, until the first receiving device is aligned in its second alignment; rotating the intermediate piece about the first axis of rotation R1, until the intermediate piece is aligned in its second alignment; rotating the sample stage about the tilt axis T, until the lamella faces of the microsample are aligned parallel to the optical axis of the ion beam column; thinning the microsample via the focused ion beam (FIB), the ion beam being substantially perpendicularly incident on the back side of the microsample.

In an aspect, the disclosure provides a computer program comprising a sequence of control commands that causes a microscope system to carry out a method for preparing a microsample via backside thinning as disclosed herein.

The sample holder according to the disclosure can be mountable on a sample stage of the microscope system used. The microscope system can be a two-beam unit, e.g., a combined FIB-SEM unit, which includes both the function of a SEM (scanning electron microscope) and that of an ion microscope with FIB (focused ion beam).

The disclosure involves the finding that it is possible to change the spatial orientation of a microsample via a sample holder which makes two additional degrees of freedom of movement available.

This is brought about in that the sample holder comprises at least two axes of rotation (R1 and R2), which are next to one another in an open kinematic chain and form an angle in relation to one another of approximately 90°. This means that the two axes of rotation R1 and R2 are stacked one on top of the other, the microsample being downstream of the second axis of rotation R2.

In other words, the disclosure provides a sample holder comprising at least two rotatable elements arranged one behind the other in an open kinematic chain, it being possible for the second element to receive a microsample.

It is also conceivable that the sample holder comprises a third rotatable element, which is rotatable about a third axis of rotation R3 and is downstream of the second element in the kinematic chain of the sample holder. In this case, the third element is configured to receive the microsample.

The sample holder has a base face, which can be arranged in a plane spanned by the X axis and the Y axis in the coordinate system of the microscope system used. The first axis of rotation R1 of the sample holder can be arranged at an angle of 45° relative to the base face, while the second axis of rotation R2 can be aligned relative to the first axis of rotation approximately at an angle of 90°. The angle between the two axes of rotation R1 and R2 may also deviate from 90°, and be for example 92°, 94°, 88° or 86°.

It has been found to be desirable for the first axis of rotation R1 of the sample holder to be aligned in relation to an axis of rotation R0 of the sample stage at an angle of 45°, the axis of rotation R0 being the last member of a kinematic chain formed by the rotary elements of the sample stage.

The angle between the first axis of rotation R1 of the sample holder and the base face is, however, not limited to 45°. Instead, it is also conceivable for this angle to take a value between 30° and 60°, such as between 40° and 50°.

By virtue of the interaction between the possible movements provided by the first axis of rotation R1 and the second axis of rotation R2, the microsample can be transferred into a spatial orientation in which backside thinning is possible.

This means that the microsample can be transferred from an initial orientation (as a result of the orientation of the microsample when it is cut out of the sample block) to a target orientation for the backside thinning, without it needing to be detached from the sample holder and re-received on the sample holder in the process.

The sample stage is usually movable in multiple directions, so that further degrees of freedom of movement for moving the microsample can be made available by the sample stage.

The sample holder according to the disclosure can be used for backside thinning. A backside thinning lamella—also referred to as inverted lamella—can be cut out of the sample block with the FIB perpendicular to the sample surface. Optionally, the lamella can be pre-thinned, provided it is still connected to the sample block (that is to say the original sample).

In that case, the lamella can be removed with a micromanipulator. For the subsequent thinning process, the removed lamella can be rotated such that its side that previously faced toward the ion beam now faces away from the ion beam. This means that that edge of the lamella that corresponds to the original sample surface can now be aligned such that it is not irradiated by the ion beam. Instead, that side of the lamella that was originally inside the sample block now can face toward the incident ion beam.

The sample holder according to the disclosure can allow the desired change in the spatial orientation of the sample (i.e. the lamella) in that the sample holder provides two additional possible rotations. Therefore, to perform the backside thinning, neither repeated repositioning of the sample nor a micromanipulator with an axis of rotation is used.

A method for preparing an inverted lamella in which the spatial orientation of the lamella is changed in a defined way is also disclosed.

BRIEF DESCRIPTION OF THE DRAWINGS

Exemplary embodiments of the disclosure are described below with reference to figures. Therefore, in order to explain the components, reference is also made to the respectively preceding and subsequent description in its entirety.

FIG. 2A and FIG. 2B illustrate a special embodiment in which the two axes of rotation of the sample holder are at right angles in relation to one another. In this respect, FIG. 2A shows a three-dimensional illustration, while FIG. 2B shows a side view of the same sample holder. FIGS. 2C and 2D show two further, alternative embodiments of the sample holder.

FIGS. 4A-4N schematically shows the method according to the disclosure for preparing inverted lamellae, during which method the spatial orientation of the lamellae is changed using the proposed sample holder. FIGS. 4A to 4I are schematic three-dimensional illustrations, while FIGS. 4J to 4N show both the schematic three-dimensional illustration (in each case from above) and a cross-sectional view (in each case from below).

FIGS. 6A-6B depict a mathematical description of the degrees of freedom of movement of the sample holder according to the disclosure.

FIG. 8 shows a two-beam unit (combined FIB-SEM unit) that can be used to carry out the method according to the disclosure.

DETAILED DESCRIPTION

FIGS. 1A-1D schematically show the various spatial orientations of importance in the preparation of a backside thinning lamella.

Illustrated is a TEM lamella 3, which is cut out of a sample block 1 and extracted in the form of a cross-sectional lamella. The sample block 1 may have a functional layer 8 directly on the sample surface 2, for example transistor structures or memory cells.

Figures 1A, 1B, 1C, 1D, 1E:
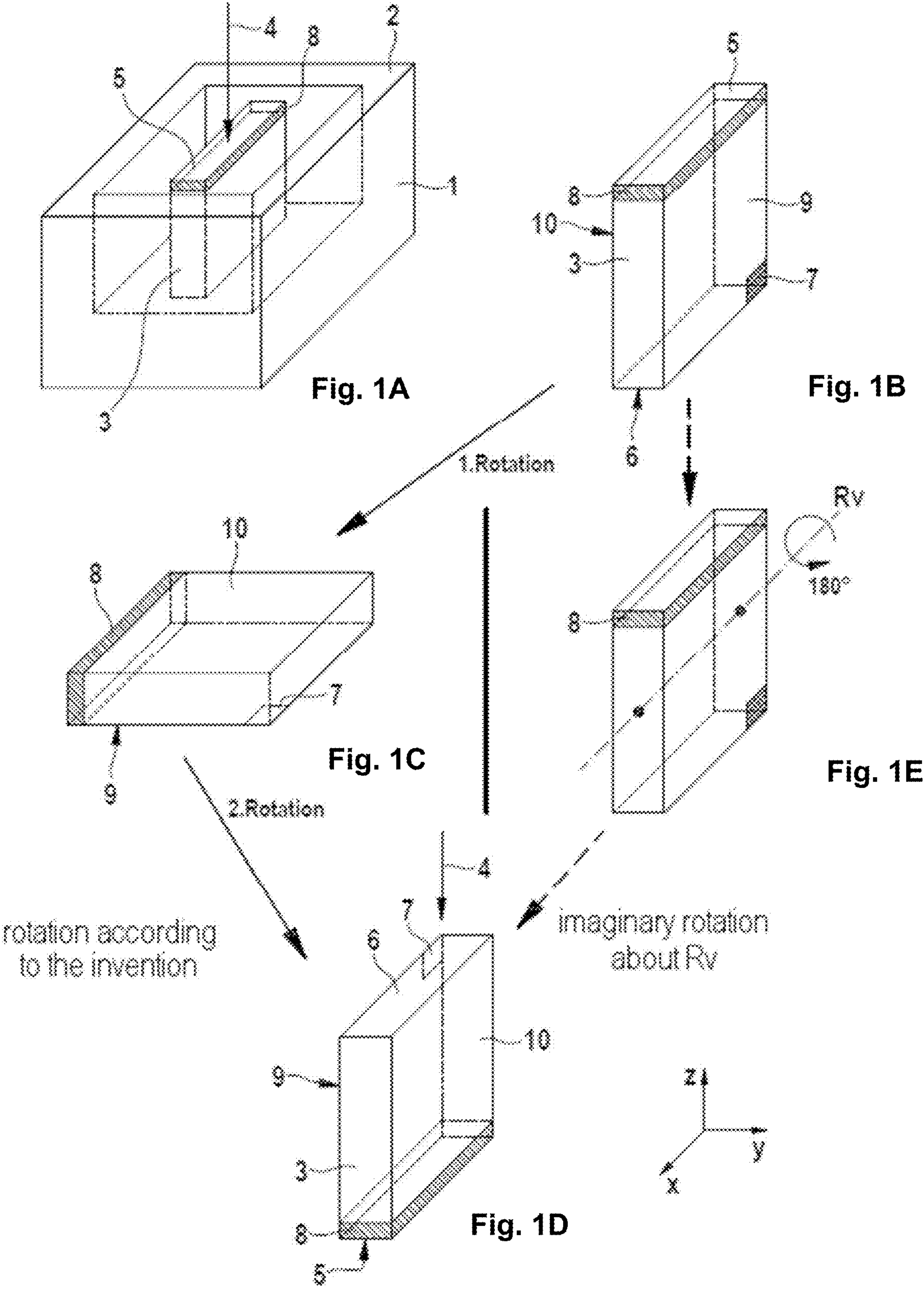
FIGS. 1A-1E depict the change in the spatial orientation of an extracted microsample (a TEM lamella in the case shown) that is used for backside thinning.

The extracted TEM lamella 3 has a side edge 5, which originally was a part of the sample surface 2. FIGS. 1A-1B show the initial orientation assumed by the TEM lamella 3 before (FIG. 1A) and directly after (FIG. 1B) extraction from the sample block 1. The TEM lamella 3 can be cut out of the sample block 1 via a focused ion beam (FIB) 4 and extracted using a micromanipulator (not illustrated).

That side edge of the lamella 3 that faced toward the incident ion beam 4 during the cutting-out operation is referred to as front side 5. The front side 5 corresponds to the sample surface 2 with the functional layer 8 in the original position in the sample block 1.

The lamella edge that was originally inside the sample block 1 is referred to as back side 6. The marking 7 sketched in FIGS. 1A-1D serve merely to better depict the step-by-step change according to the disclosure in the spatial orientation. The TEM lamella 3 has a first lamella face 9 and a second lamella face 10. The marking 7 is arranged for example on the first lamella face 9, in order to identify this lamella face.

Since the TEM lamella 3 can be cut (i.e. milled) out of the sample block via a focused ion beam, the surface 2 of the sample block should be aligned more or less perpendicularly in relation to the incident ion beam 4. Therefore, the sample surface 2 is aligned parallel to a plane which is spanned by the X and Y directions.

Owing to the alignment described, the longitudinal side of the lamella is oriented parallel to the incident ion beam 4, that is to say parallel to the optical axis of the ion beam column, so that the ion beam 4 is incident with grazing incidence relative to the lamella longitudinal sides (also referred to as lamella faces below).

FIG. 1B shows the initial orientation of the extracted TEM lamella 3, that is to say the spatial orientation assumed by the TEM lamella 3 directly after the lift out.

By contrast, FIG. 1D shows the spatial orientation (target orientation) used for backside thinning of the TEM lamella. In this case, the back side 6 faces toward the incident ion beam 4, so that in this spatial orientation the backside thinning of the lamella can begin.

In order to transfer the spatial orientation of the lamella from the initial state (FIG. 1A) to the desired orientation (FIG. 1D), the lamella is thus be rotated only by 180° about an imaginary axis Rv (FIG. 1E).

According to the disclosure, however, the change in spatial orientation is realized differently, as illustrated in FIG. 1C. Specifically, the spatial orientation of the lamella is changed by a first rotation such that the front side 5 and back side 6 are aligned parallel to the incident ion beam 4 (that is to say parallel to the optical axis), as illustrated in FIG. 1C, while the first lamella face 9 (with the marking 7) now faces away from the incident ion beam and the second lamella face 10 now faces toward the ion beam perpendicularly incident on it.

Then, the lamella is rotated in a second rotation such that the front side 5 and the back side 6 are aligned perpendicularly in relation to the incident ion beam (that is to say perpendicularly in relation to the optical axis), the back side 6 now facing toward the incident ion beam (FIG. 1D). Here, the positions of the first lamella face 9 and the second lamella face 10 are now swapped by comparison with the initial situation.

In order to change the spatial orientation according to the disclosure as described, use is made of a specially designed sample holder, which is shown in FIGS. 2A-3C and described in more detail below.

Figures 2A, 2B:
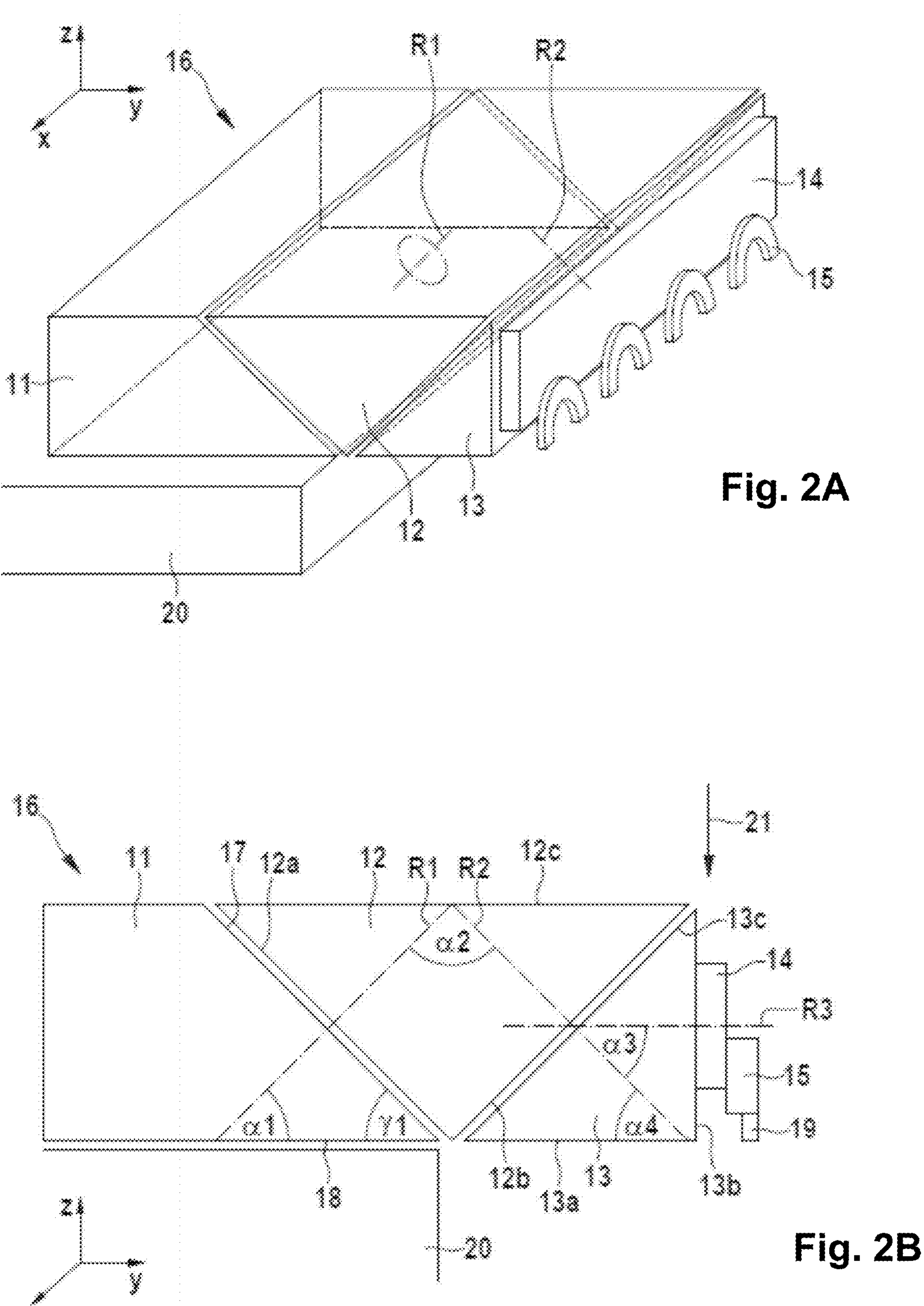
FIGS. 2A-2D schematically shows a sample holder according to the invention.

The sample holder 16 is mountable on a sample stage 20 of a microscope system (as illustrated in FIG. 2A and FIG. 2B), so that the sample holder can be inserted in the sample chamber of the microscope system. Vacuum conditions generally prevail in the sample chamber during operation. Therefore, the sample holder 16 is designed such that it can be used in a sample chamber under vacuum conditions.

A sample stage 20 usually makes multiple degrees of freedom of movement available for moving a received sample. For example, the sample stage may comprise five axes, namely three translational axes X, Y and Z and two rotational axes R0 and T (tilt).

In general, the movements of the sample stage are brought about in that the translational and rotational movement elements are arranged one after another in an open kinematic chain. The axes may be arranged, for example, in the sequence Z-T-X-Y-R0, with the sample to be examined being connected to the last movement element of the sample stage. This is also referred to as stacking of the movement axes (axis stacking).

The arrangement in an open kinematic chain means that each movement element carries out not only the movement brought about by it, but also passively the movement of those movement elements arranged upstream of the movement element in the chain.

The sample holder 16 according to the disclosure is mountable on a sample stage 20 such that the sample holder 16 is connected to the last movement element of the kinematic chain of the sample stage. The sample holder 16 is thus connected, for example, to the movement element that brings about the rotation about the axis of rotation R0.

The sample holder 16, for its part, makes available two axes of rotation, which are referred to as R1 and R2 and are likewise arranged one after the other in a kinematic chain.

For a sample received on the sample holder 16, two additional degrees of freedom of movement-apart from the degrees of freedom of movement of the sample stage used—are thus provided by the sample holder 16. It is not important in this respect whether the sample stage (and with it also the received sample holder) is tilted or not tilted by rotation about the tilt axis T of the sample stage.

Embodiments of the sample holder 16 according to the disclosure are schematically shown in FIGS. 2A-2D.

The sample holder 16 comprises a base plate 11, an intermediate piece 12 and a first receiving device 13. The intermediate piece 12 is arranged between the base plate 11 and the first receiving device 13. The first receiving device 13 is configured to directly or indirectly receive a TEM grid 15 for receiving a microsample (e.g. a TEM lamella).

The TEM grid 15 is used as sample carrier and can directly receive the TEM lamella 19 or the precursor of a TEM lamella, in order to provide the TEM lamella for processing and/or examination in the microscope system. During the microscopic processing and/or examination, the microsample 19 is usually irradiated with a particle beam 21 (electron beam or ion beam).

The TEM grid 15 may be arranged directly on the first receiving device 13 (not illustrated) or on a second receiving device 14 (as illustrated in FIG. 2B). In the latter case, the second receiving device 14 is arranged on the first receiving device 13. The TEM grid 15 may be arranged on any respective desired side face of the receiving device used.

It is also conceivable for multiple sample carriers (TEM grids) to be arranged on the respective receiving device, so that a multiplicity of microsamples can be provided by the sample holder according to the disclosure at the same time.

The base plate 11 of the sample holder 16 has a base face 18, the base face 18 being mountable on a sample stage 20 of the microscope system used. In this respect, the base face 18 can be designed such that it can be received directly on the sample stage 20 and is aligned perpendicularly in relation to an optical axis of the microscope system. The base face 18 can be arranged in the plane of the sample stage 20, this plane being spanned by the X axis and the Y axis.

It has been found to be desirable for the first axis of rotation R1 of the sample holder to be aligned in relation to an axis of rotation R0 of the sample stage at an angle of 45°, the axis of rotation R0 being the last member of a kinematic chain formed by the rotary elements of the sample stage.

The sample stage 20 and the base plate 11 are designed and connected to one another such that the rotational movements that the intermediate piece 12 and the first receiving device 13 can perform and that will be described in more detail below are not adversely affected.

The intermediate piece 12 is rotatably connected to the base plate 11. To this end, the sample holder 16 has a first axis of rotation R1, about which the intermediate piece 12 can rotate relative to the base plate 11. The first axis of rotation R1 is arranged at an angle $\alpha$1 relative to the base face 18. The angle $\alpha$1 may be, for example, 45°.

The first receiving device 13 is rotatably arranged on the intermediate piece 12. To this end, the first receiving device 13 is rotatable about a second axis of rotation R2 relative to the intermediate piece 12, the second axis of rotation R2 being arranged at an angle $\alpha$2 relative to the first axis of rotation R1. According to the first embodiment of the sample holder according to the disclosure, the angle $\alpha$1=−45° and the angle $\alpha$2=90°.

The two axes of rotation R1 and R2 are arranged one after the other in a kinematic chain, R2 being downstream of R1. In this respect, the rotation about the axis R2 can be performed first, and only then the rotation about the axis R1. However, it is also conceivable for the rotations about the axes of rotation R1 and R2 to be performed at the same time.

It is also conceivable for the sample holder to optionally comprise a third axis of rotation R3, as illustrated in FIG. 2B. The third axis of rotation R3 makes it possible to arrange the second receiving device 14 rotatably relative to the first receiving device 13 about the axis R3. In this case, all three axes of rotation are arranged one after another in a kinematic chain, with R3 being downstream of R2 and R2 being downstream of R1.

In all cases, the TEM lamella is arranged on the respective last element of the kinematic chain, so that the TEM lamella performs all the movements brought about by rotation about one or more axes of rotation. The rotational movements about the axes of rotation R1, R2 and R3 can be performed one after another in a certain sequence or at the same time.

The intermediate piece 12 of the sample holder 16 may have, for example, a triangular shape as seen in side view, that is to say in profile view, as illustrated in FIG. 2B.

In the case of this special embodiment shown in FIG. 2B, the base plate 11 has a side face 17 in addition to the base face 18. The base face 18 and the side face 17 can form an angle γ1 of 45° in relation to one another.

The intermediate piece 12 is rotatably connected to the first side face 17 of the base plate 11. The first axis of rotation R1, about which the intermediate piece 12 is rotatable relative to the base plate 11, adjoins the first side face 17 at an angle α1 relative to the base face 18. The angle α1 may be, for example, 45°, so that the axis of rotation R1 is aligned at right angles to the first side face 17, as illustrated in FIG. 2B.

The profile of the intermediate piece 12 may be in the form of an isosceles right triangle. The first leg 12*a* of this triangle is situated opposite the first side face 17 of the base plate 11, whereas the second leg 12*b* is situated opposite the first receiving device 13. The third side of the triangular profile is formed by the hypotenuse 12*c*.

The profile shape of the intermediate piece 12 is, however, not restricted to that of a triangle. Instead, the intermediate piece 12 may also take any desired other shape, for example a cylindrical, elliptical or another type of shape. Such alternative configurations are schematically illustrated in profile view in FIG. 2C (cylindrical cross section) and FIG. 2D (elliptical cross section). The profile shape is designed such that the rotational movements about the axes R1 and R2, and also R3 (if present), are not adversely affected.

The first receiving device 13 may also have the shape of a isosceles right triangle as seen in profile view, the triangular profile comprising the two legs 13*a* and 13*b* and the hypotenuse 13*c*. The hypotenuse 13*c* of the first receiving device 13 is situated opposite the second leg 12*b* of the intermediate piece 12 and rotatably connected to the second leg 12*b* about the axis of rotation R2.

That side face of the first receiving device 13 that is delimited by the second leg 13*b* is formed such that a TEM grid 15 can be directly received there. The TEM grid 15 has the function of a sample carrier, which can directly receive a TEM lamella 19. The sample usually remains on the TEM grid both during the sample preparation and during the subsequent examination by transmission electron microscope.

Figure 2C:
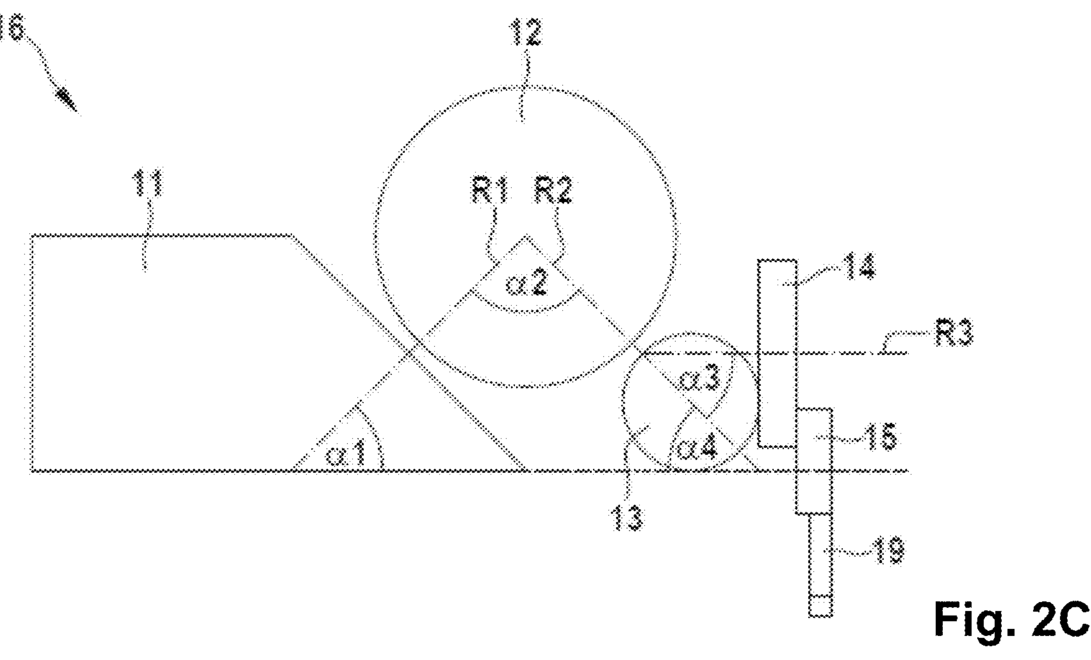
Figure 2D:
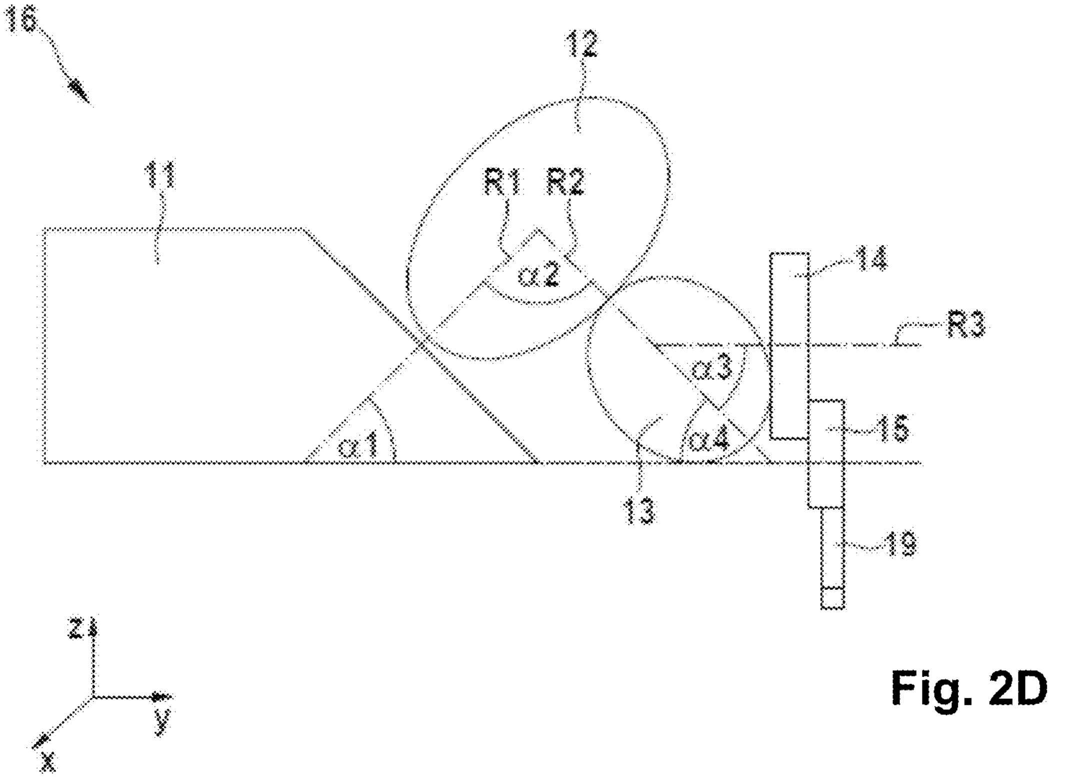

The shape of the first receiving device 13 is not restricted to the triangular shape described, since the receiving device 13 may also take a different shape, for example cylindrical or elliptical, as illustrated in FIG. 2C and FIG. 2D.

In any case, the sample holder according to the disclosure makes available two degrees of freedom of movement, namely the rotation of the intermediate piece 12 about the axis of rotation R1 and the rotation of the first receiving device 13 about the axis of rotation R2, the two axes of rotation being arranged one behind the other. According to the disclosure, the microsample to be examined is downstream of the axis of rotation R2, which means that the microsample passively respectively changes its spatial orientation when rotations about the axis of rotation R1 and/or the axis of rotation R2 are performed.

The intermediate piece 12 can be transferred from a first alignment to a second alignment relative to the optical axes of the microscope system used by a rotation by 180° about the first axis of rotation R1.

In the first alignment of the intermediate piece 12, which is illustrated in FIG. 2B and FIG. 4J, the hypotenuse 12*c* is aligned parallel to the base face 18 of the base plate 11. The intermediate piece 12 can be transferred into the second alignment by rotation about the first axis of rotation R1. In the second alignment, the hypotenuse 12*c* is aligned perpendicularly in relation to the base face 18 (FIG. 4M).

Similarly, the first receiving device 13 can be transferred from a first alignment to a second alignment relative to the optical axes of the microscope system used by a rotation by 180° about the second axis of rotation R2. In the first alignment of the receiving device 13, which is illustrated in FIG. 2B and FIG. 4J, the first leg 13*a* is aligned parallel to the base face 18 of the base plate 11, while the second leg 13*b* is oriented at right angles to the hypotenuse 12*c* of the intermediate piece 12.

The first receiving device 13 is transferred into the second alignment by rotating about the second axis of rotation R2 by 180°. In this second alignment, the second leg 13*b* is then parallel to the hypotenuse 12*c* of the intermediate piece 12 (FIG. 4*k*).

In a further alternative embodiment of the sample holder, it is also conceivable for the intermediate piece and the first receiving device to be formed as one element, i.e. formed on one piece. The element then comprises the two axes of rotation R1 and R2, functionally without itself having a special geometric shape.

Figure 4A:
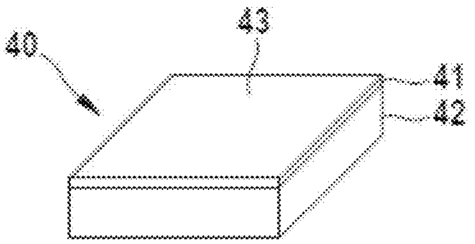
Figure 4B:
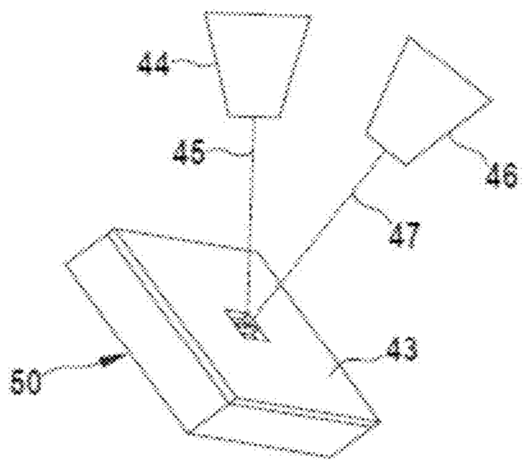
Figure 4C:
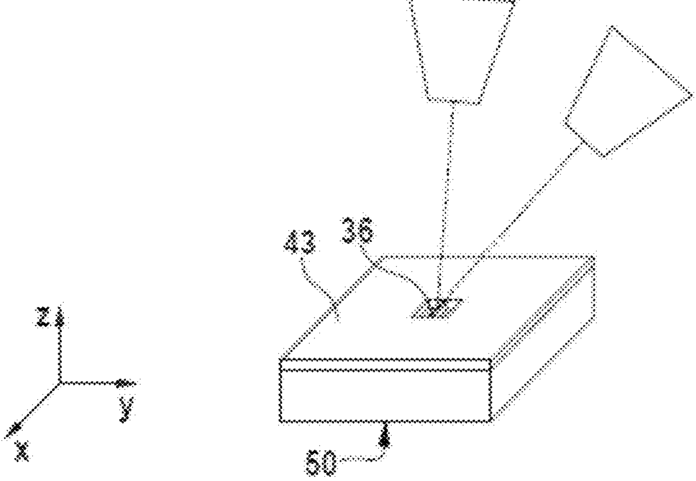
Figures 4D, 4E, 4F:
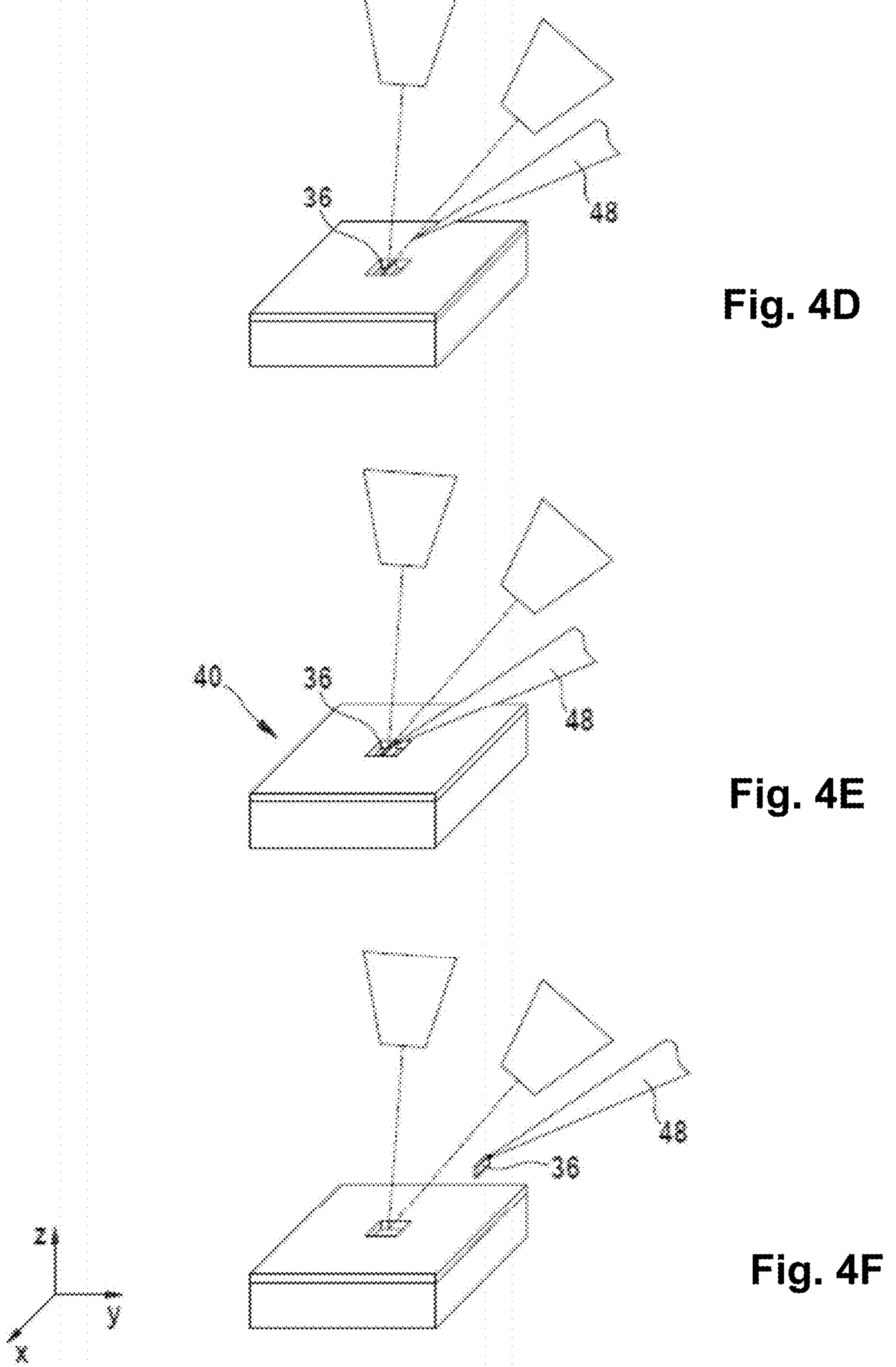
Figures 4G, 4H, 4I:
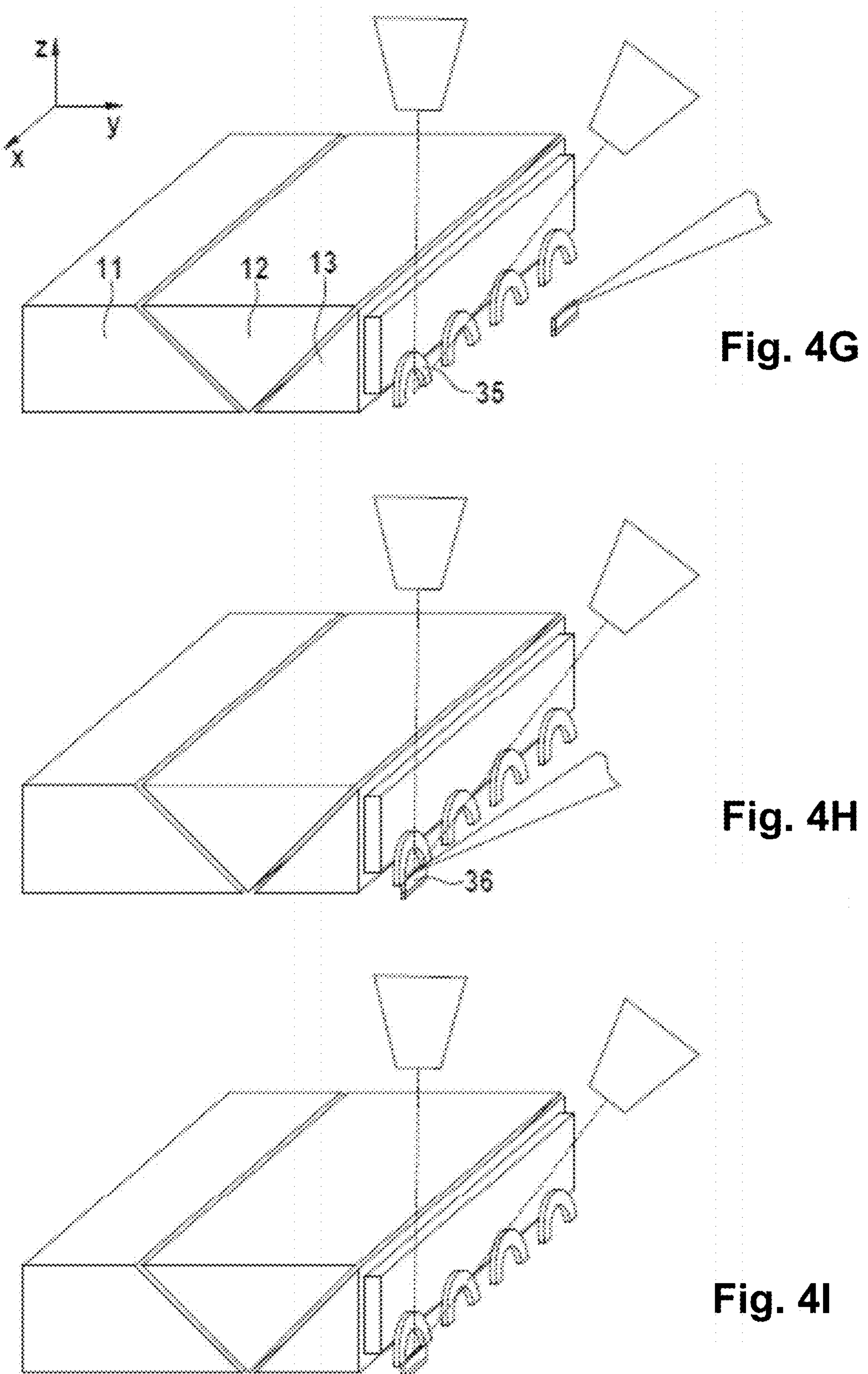
Figure 4K:
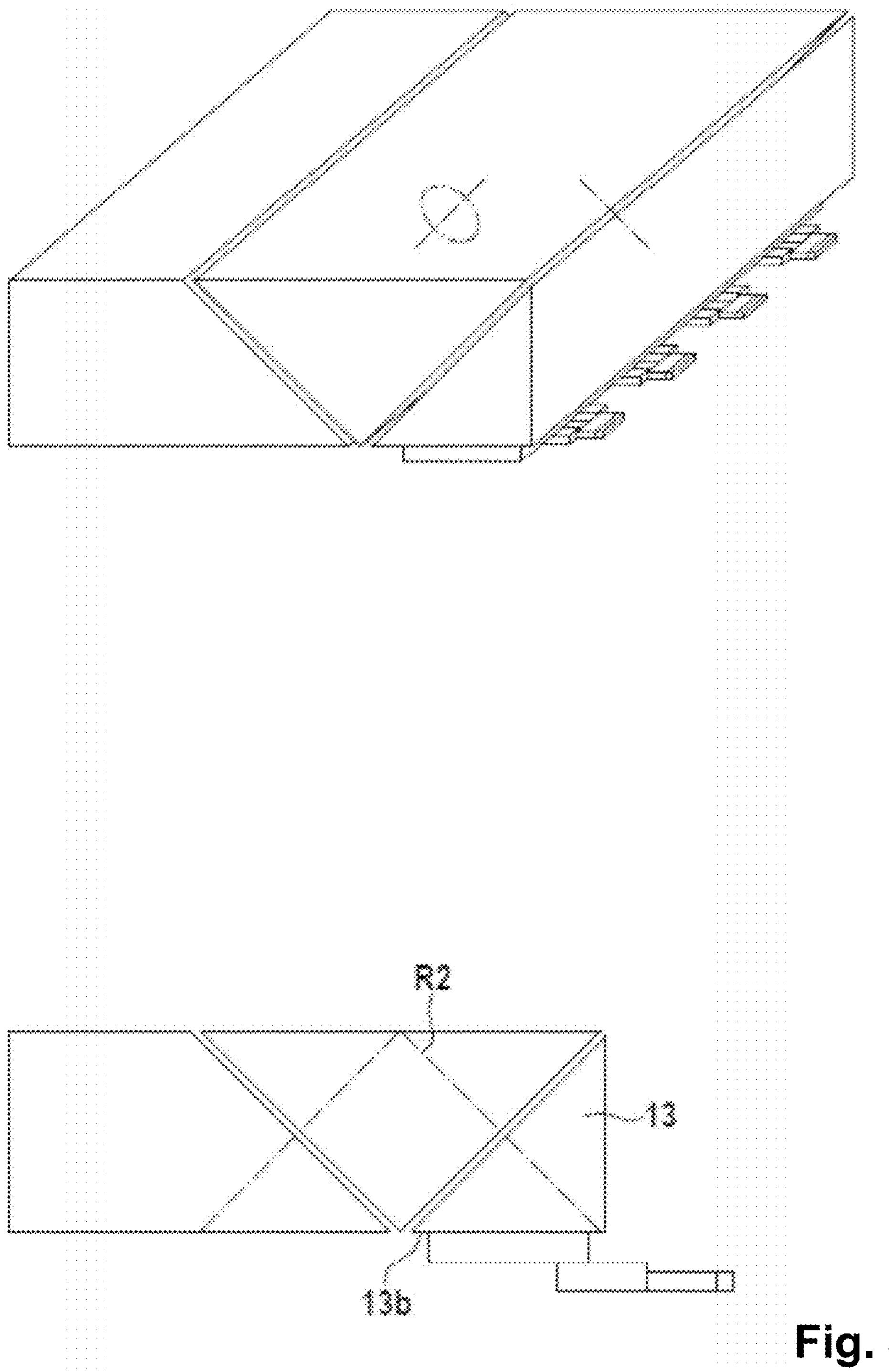
Figure 5:
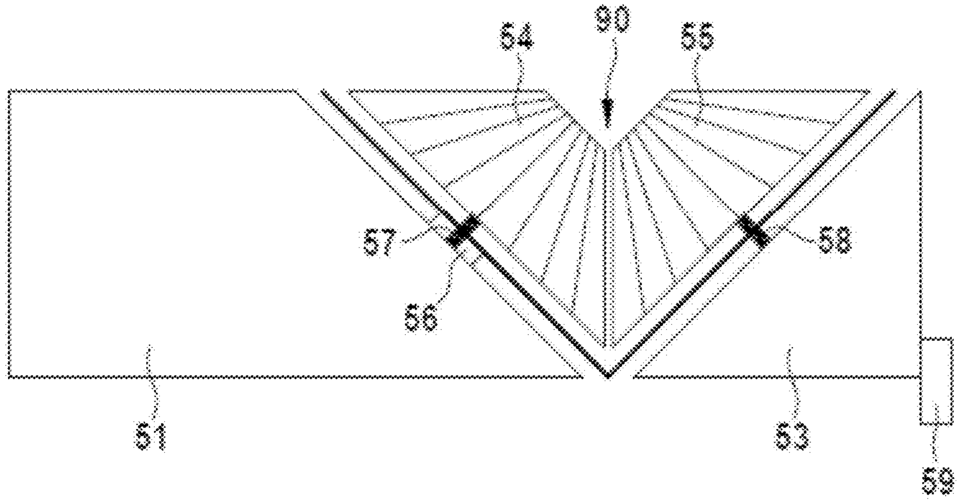
FIG. 5 shows the sample holder according to the disclosure with an exemplary drive for realizing the rotational movements.

FIGS. 4 and 5 schematically show the method according to the disclosure for preparing a microsample for backside thinning.

The method is carried out using a microscope system. The microscope system can be a two-beam unit, which comprises an electron beam column 44 for generating an electron beam and an ion beam column 46 for generating a focused ion beam. The electron beam column 44 has a first optical axis 45, while the ion beam column 46 comprises a second optical axis 47. Each of the particle beam columns comprises a particle beam source, in which electrons or ions can be correspondingly generated.

The microscope system also comprises a movable sample stage, which has at least one axis of rotation T (tilt axis) that makes it possible to tilt the sample stage relative to the optical axes. The tilt axis T usually lies in a plane spanned by the X and Y directions and extends perpendicularly in relation to the Z direction.

FIG. 4A schematically shows a sample block 40, from which a TEM lamella is to be prepared. The sample block 40 substantially consists of the sample substrate 42 and may have a functional layer 41 on one side face. The sample block 40 is provided on a sample stage in the sample chamber of the microscope system.

First of all, the sample stage (and thus also the sample block) is tilted such that the ion beam is substantially perpendicularly incident on the sample surface. In order to achieve this, the sample stage can be rotated about the tilting axis T, for example to 54° relative to the horizontal (i.e. to the X axis of the sample stage) (FIG. 4B). The TEM lamella 36 can then be cut out of the sample block via the focused ion beam (FIB) (FIG. 4B).

Accordingly, the TEM lamella 36 has a side which faced toward the ion beam during the processing. This side is referred to as front side 43. The TEM lamella 36 comprises a further side, which faced away from the ion beam during the processing and is referred to as back side 50. The back side is generally situated opposite the front side and was originally inside the sample block 40 (original sample).

Then, the sample stage is tilted back to the horizontal again (FIG. 4C). In the aforementioned example, the sample stage is thus tilted to 0° or a negative tilt, for example −4°, so that the ion beam can then be used to cut along the bottom edge of the TEM lamella 36. However, it is also conceivable for the sample stage to be tilted to a greater extent, for example to −15°. The selection of the tilt angle generally depends on the user and the microscope system used.

The TEM lamella 36 is initially not yet completely severed. Instead, a small residual connection between the lamella 36 and the sample block 40 remains.

If the embodiment of the sample holder illustrated in FIG. 2B is used, both the lift out of the TEM lamella from the sample block and the attachment of the TEM lamella to the TEM grid can be performed to a slightly negative tilt angle, e.g. to −4° (as illustrated in FIG. 4C to FIG. 4I).

If there is no tilt (0° tilt), this would mean that the TEM grid is aligned exactly perpendicularly, and therefore the location at which the TEM lamella is to be fastened would not be accessible for observation by the SEM (scanning electron microscope). If, by contrast, observation using the SEM can be done without and it is possible to navigate the TEM lamella only with reference to the FIB image, a 0° tilt of the sample stage would also be conceivable by way of exception.

Figures 3A, 3B, 3C:
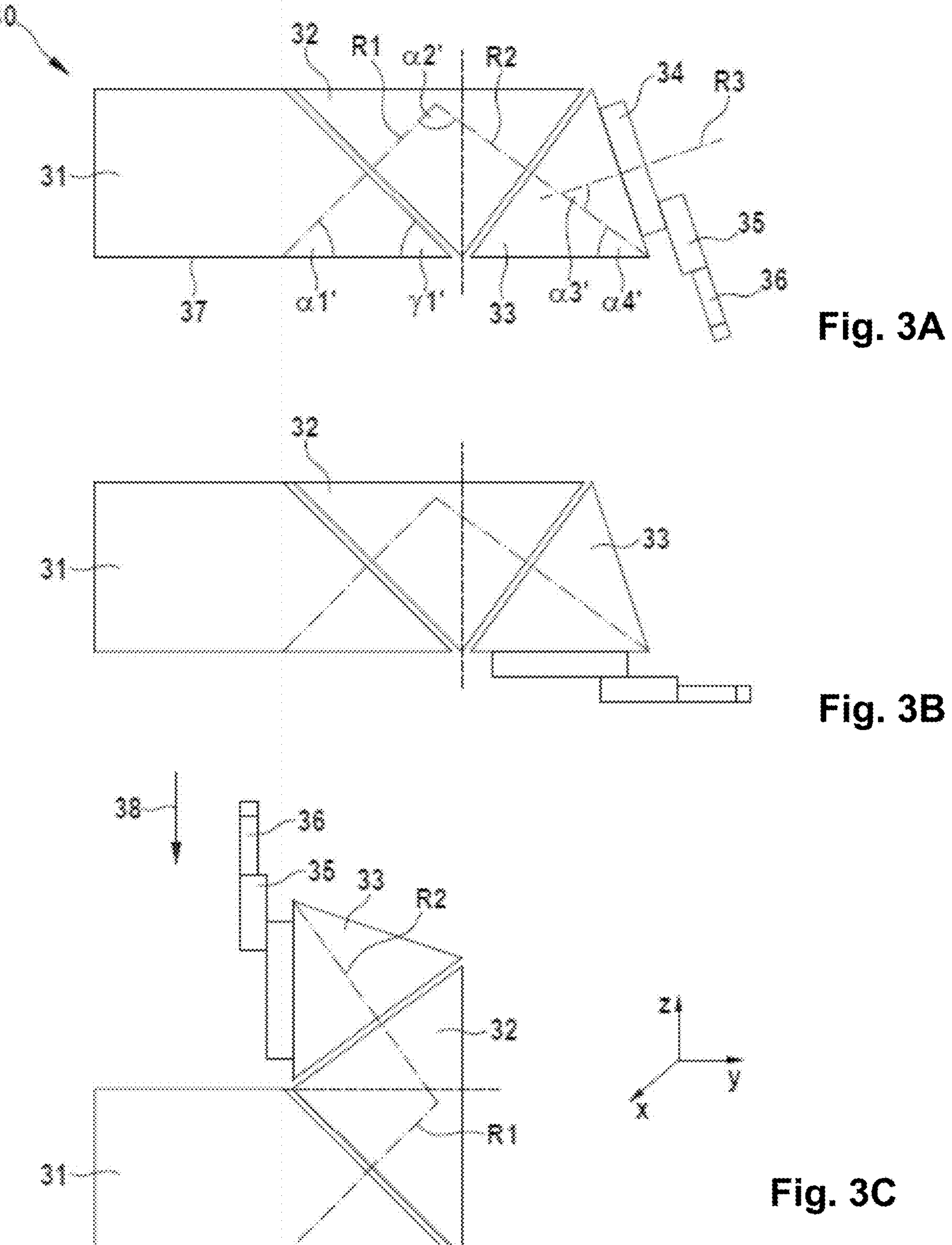
FIGS. 3A-3C show an alternative embodiment of the sample holder in which the two axes of rotation of the sample holder are not at right angles.

If the alternative embodiment of the sample holder illustrated in FIG. 3 is used, a negative tilt, for example a tilt of −4°, of the sample stage should be selected for the lift out of the TEM lamella (FIG. 4D to 4F). By contrast, the TEM lamella should be attached to the TEM grid without tilting of the sample stage. This is possible since, owing to the special geometry of the alternative embodiment, the TEM grid can be observed by the SEM even with a 0° tilt of the sample stage.

In the next step (FIG. 4D), the tip of a micromanipulator 48 is moved up to the TEM lamella 36.

The micromanipulator tip 48 is then fastened to the TEM lamella 36 (FIG. 4*e*). This can be brought about, for example, by ion-beam-induced deposition of a suitable material from the gas phase. For example, platinum can be deposited. Then, the connection between the TEM lamella 36 and the sample block 40 is severed.

Moving the micromanipulator tip 48 causes the TEM lamella 36 to be lifted out of the sample block 40 (FIG. 4F).

Then, the sample holder according to the disclosure is provided in the working region in the sample chamber (FIG. 4G), the intermediate piece 12 being aligned in the first alignment and the first receiving device 13 being aligned in the first alignment. The first alignment of the intermediate piece 12 is distinguished in that the hypotenuse 12*c* of the intermediate piece 12 is aligned parallel to the base face 18. In the first alignment of the first receiving device 13, the leg 13*a* of the receiving device 13 is aligned parallel to the base face 18.

The first receiving device 13 provides a sample carrier, for example a TEM grid 35, for receiving the TEM lamella 36.

The sample holder can be tilted by tilting the sample stage about the tilt axis T to the same angle relative to the optical axes in which the lift out was effected, in the aforementioned example thus to −4°.

The tip of the micromanipulator 48 with the received extracted TEM lamella 36 is then brought into the vicinity of the TEM grid 35. Under observation using the SEM, the TEM lamella 36 is moved up to a finger of the TEM grid 35. Therefore, a small over-tilt is desirable in order for the finger of the TEM grid 35 to be accessible for imaging by the electron beam.

Then, the TEM lamella 36 is fastened to the TEM grid 35 (FIG. 4H), e.g. by ion-beam-induced deposition of a suitable material from the gas phase, e.g. platinum. Then, the connection between the micromanipulator tip 48 and the TEM lamella 36 is severed by the ion beam.

The micromanipulator tip 48 is then withdrawn (FIG. 4I). If appropriate, further TEM grids 35 can be charged with extracted TEM lamellae 36 (FIG. 4J).

As illustrated in FIG. 4I, the TEM lamellae 19 are in the initial orientation, in which the lift out from the sample block also took place. After tilting the sample stage back to a 0° tilt (FIG. 4J), the TEM lamellae 19 are aligned such that the front side 43 faces toward the electron beam, while the substrate side faces away from the electron beam.

The first receiving device 13 is then rotated by 180° about the second axis of rotation R2 (FIG. 4K) until the first receiving device is oriented in its second alignment (FIG. 4K). In the meantime, the intermediate piece 12 remains in its first alignment.

The second alignment of the first receiving device is characterized in that the second leg 13*b* is now parallel to the hypotenuse 12*c* of the intermediate piece 12.

After this rotation, the TEM grids and the TEM lamellae are in a horizontal position, in which the front side 43 and the back side 50 of the TEM lamella are aligned perpendicularly in relation to the optical axis of the electron beam column.

The intermediate piece 12 is then rotated by 180° about the first axis of rotation R1 (FIG. 4L), until the intermediate piece 12 is in its second alignment (FIG. 4M). In the second alignment of the intermediate piece 12, the hypotenuse 12*c* of the intermediate piece 12 is aligned at right angles to the base face 18. In the process, the alignment of the first receiving device 13 with respect to the second axis of rotation R2 remains unchanged.

After the rotation of the intermediate piece, the TEM lamella 36 is in a "vertical" alignment (FIG. 4M) again, i.e. the substrate side faces in the direction toward the particle beam source. This means that, in this spatial orientation, the back side 50 of the TEM lamella can be irradiated by the incident ion beam. This is the spatial orientation of the TEM lamella that is desired for backside thinning.

The sample stage is then tilted by rotation about the tilt axis T (FIG. 4N) until the faces of the TEM lamellae 36 are aligned parallel to the ion beam. The desired tilt angle also in this case depends on the geometry of the microscope system used. The sample stage can thus be tilted, for example, to 54°.

This tilting causes the ion beam to be incident more or less perpendicularly on the back side and with grazing incidence on the lamella face. In this spatial orientation, the TEM lamella 36 can be thinned by backside thinning until it has the desired electron transparency.

FIG. 3 shows an alternative embodiment of the sample holder 30 according to the disclosure. This embodiment differs from the embodiments of FIGS. 2A-2D in the geometry of the angles α2 and α3 (here denoted α2' and α3').

The intermediate piece 32 and the first receiving device 33 of the alternative embodiment are formed such that the angle α2' between the first axis of rotation R1 and the second axis of rotation R2 is not exactly 90°, but rather, for example, 92°. This means that the angle α2' is greater than 90° by a value x. The value x may be 2°, as in the example cited.

It thus generally holds true for the angle α2' that α2'=(90+x)°. The value x can be between 0° and 20°. The value x can be between 1° and 20°, so that the angle α2' can take values of 91° to 110°.

Of course, the cited definition of the angle α2' also holds true for the angle α2 in the embodiment described with reference to FIG. 2. In this special embodiment, x takes the value 0°, so that the angle α2 formed between the first axis of rotation R1 and the second axis of rotation R2 is a right angle.

In the alternative embodiment in FIG. 3, in which x is not 0°, the angle α2 (denoted α2' in FIG. 3) formed between the first axis of rotation R1 and the second axis of rotation R2 correspondingly changes. In this case, the angle α2' takes a value of (90+x)°, and in the specific case of FIG. 3 it thus holds true that α2'=92°.

As a result, in the initial position, used for mounting the lamella on the TEM grid, of the holder the TEM lamella is not aligned parallel to the Z direction and therefore is not aligned perpendicularly in relation to the incident electron beam, as illustrated in FIG. 3A. As a result of the changed geometry of the sample holder, more space can be made available in the region underneath the objective lenses of the microscope system and therefore collisions of the sample with microscope components are avoided. This can be desirable if the sample holder is used in a two-beam unit in which the sample is positioned at the point of coincidence of the two particle beams.

Accordingly, the alternative sample holder 30 in FIG. 3 can also be moved in the same way as described for the sample holder in FIG. 2. First of all, the first receiving device 33 is rotated by 180° about the second axis of rotation R2, so that the TEM lamella 36 is aligned parallel to the base face 18 (FIG. 3B).

Then, the TEM lamella 36 can be rotated into the target orientation for the backside thinning by rotation about the axis of rotation R1 (FIG. 3C), so that the back side of the TEM lamella 36 then faces toward the electron beam 38.

In all the embodiments of the sample holder, it has proven to be desirable for the sample holder to be configured such that the first axis of rotation R1 and the second axis of rotation R2 of the sample holder 16, 30 can be moved independently of one another. It is also conceivable for both axes of rotation R1, R2 to be moved at the same time.

In a straightforward embodiment of the sample holder, the two axes of rotation R1 and R2 have a passive configuration. The rotational movements are then performed manually directly at the sample holder.

The force used to move the axes can, however, also be applied by an external device. Using a suitable mechanism integrated in the sample holder 16, 30, the rotational movements can be brought about, for example, via an actuator. For this, the sample holder may comprise, for example, a switching element, which can be used to bring about the rotation about the first axis of rotation R1. By moving the sample stage on which the sample holder 16, 30 is mounted, the switching element can be brought into mechanical contact with an actuator. The actuator may be arranged, for example, on the wall of the sample chamber. The rotation about the first axis of rotation R1 is triggered by the mechanical impulse of this touching contact.

However, it is also conceivable for a motor drive to be integrated in the sample holder 16, 30.

The rotation about the second axis of rotation R2 may be achieved, for example, using a gearwheel mechanism or via a double-output shaft or a hollow shaft.

FIG. 5 shows the sample holder according to the disclosure with an exemplary single-output drive.

The sample holder has a base plate 51. A connecting element 90, which comprises a first bevel gear 54 and a second bevel gear 55, is arranged between the base plate 51 and the first receiving device 53. A microsample (TEM lamella) 59 is received on the first receiving device 53.

A drive 56 arranged on the base plate 51 is able to rotate the connecting element 90, which comprises the first bevel gear 54 and the second bevel gear 55.

Both bevel gears 54, 55 can be made to rotate in this way. It has been found to be desirable for the tooth ratios of the two bevel gears 54, 55 to be matched to one another.

Rotational matrices, as illustrated in FIGS. 6A-6B, can be used to mathematically describe the degrees of freedom of movement made available by the sample holder according to the disclosure.

As already described for FIG. 2B, the sample holder shown in FIG. 6A also comprises three axes of rotation R1, R2 and R3. The second receiving device 14 is thus arranged on the first receiving device 13 such that the second receiving device 14 can be rotated relative to the first receiving device 13 about the third axis of rotation R3.

FIG. 6A depicts the angle definitions that apply in this case. FIG. 6*b* reproduces the three rotational matrices which can be used to describe the movement of the three axes of rotation R1, R2 and R3 of the sample holder 16. In FIGS. 6A-6B, $\beta_1$ denotes the angle of rotation about the first axis of rotation R1, $\beta_2$ denotes the angle of rotation about the second axis of rotation R2 and $\beta_3$ denotes the angle of rotation about the third axis of rotation R3.

The TEM grid 15 is fixedly arranged on the second receiving device 14, while the TEM lamella 19 is fixedly arranged on the TEM grid 15.

The mathematical description of the movement of the receiving device 14 and thus of the TEM grid 15 and the lamella 19 fastened thereto is a chaining of the rotational matrices. The first rotational matrix describes the rotation about the first axis of rotation R1, that is to say the rotation of the intermediate piece 12 relative to the base plate 11. Similarly, the second rotational matrix describes the rotation about the second axis of rotation R2 (that is to say the rotation of the intermediate piece 12 and the first receiving device 13 relative to one another), and the third rotational matrix describes the rotation about the third axis of rotation R3 (i.e. the rotational movement of the first receiving device 13 and the second receiving device 14 relative to one another).

The multiplication of the three rotational matrices in the illustrated sequence results in a rotational matrix which transfers the coordinate system of the base plate 11 to the coordinate system of the second receiving device 14 (and thus to the coordinate system of the TEM grid 15 and the TEM lamella 19).

If the TEM grid 15 in the initial position (i.e. at the start of the rotation according to the disclosure of the microsample) is aligned in the direction of that side of the sample holder that faces away from the particle beam 21 (as illustrated in FIG. 6A), it holds true that $\beta_3=-180°$.

In this case, the following formula applies:

$$<(Z_{14},Z_{11})=-a\cos(((\sin(a_2)\sin(a_3)-\cos(a_2)\cos(a_3)\cos(b_2))\cos(b_1)+\sin(b_1)\sin(b_2)\cos(a_3))\cos(a_1)+(\sin(a_2)\cos(a_3)\cos(b_2)+\sin(a_3)\cos(a_2))\sin(a_1))$$

Figure 7:
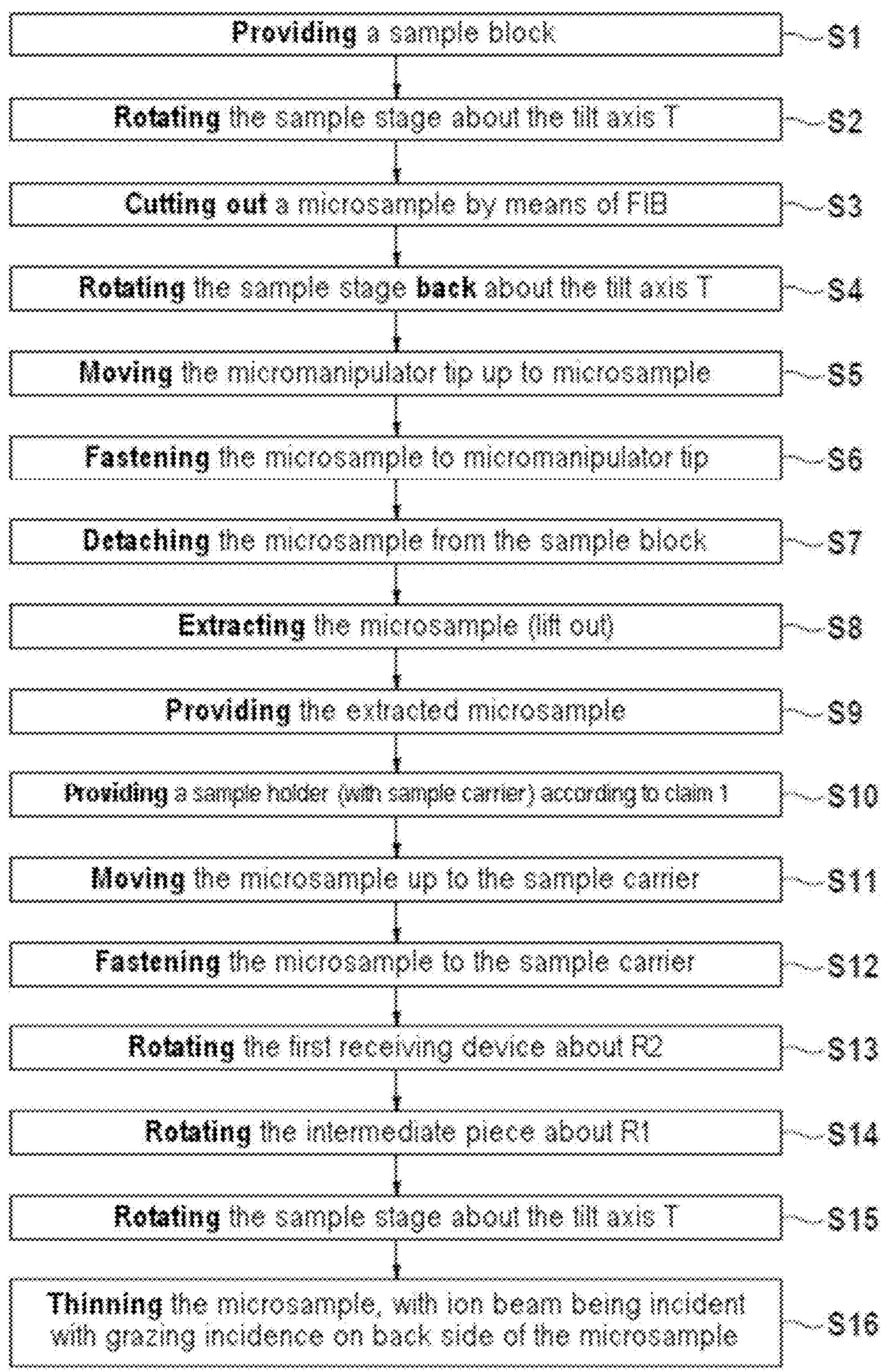
FIG. 7 shows the method for preparing inverted lamellae from FIGS. 4A-4N summarized as a flow diagram.

FIG. 7 shows the above-described method according to the disclosure summarized as a flow diagram.

First of all, a sample block is provided (step S1), from which a microsample, for example a TEM lamella, is to be prepared.

In step S2, the sample stage is tilted about a tilt axis T, so that the incident particle beam is substantially perpendicularly incident on the sample surface that is to be processed.

In the next step S3, the TEM lamella is cut out of the sample block using the focused ion beam (FIB).

Then, the sample stage is tilted back again by rotation about the tilt axis T (step S4). As an alternative, it is also conceivable to rotate it until a small negative tilt angle is established, as described above for FIG. 4.

Then, a micromanipulator tip is brought up to the microsample (step S5).

The microsample is fastened to the tip (step S6).

In the next step S7, the microsample can be detached from the sample block and then extracted (lift out, step S8).

The extracted microsample is now available (step S9).

A sample holder according to the disclosure is then provided (step S10), both the first receiving device and the intermediate piece being in their respective first alignment.

The microsample is brought up to the first receiving device (step S11) and fastened, for example by material deposition, to the sample carrier (TEM grid) located there (step S12). The sample carrier may be held on the sample holder either directly by the first receiving device or by the optional second receiving device.

Then, the first receiving device is rotated about the second axis of rotation R2, so that the first receiving device assumes its second alignment (step S13). As a result, the microsample also assumes a different spatial orientation.

Depending on the specific geometric configuration of the sample holder, the sample holder can be moved before the rotation about the axes of rotation R1 and/or R2 in the sample chamber such that there is enough space for the rotational movements. This prevents collisions. After the rotation, the sample holder can then be moved back to the previous position.

In the next step (S14), the intermediate piece is rotated about the first axis of rotation R1, so that the intermediate piece is transferred from its first alignment to its second alignment. This also correspondingly changes the spatial orientation of the microsample.

Then, the sample stage is rotated about the tilt axis T (step S15), until the lamella faces (longitudinal sides) of the microsample are aligned parallel to the optical axis of the ion beam column. The substrate side (back side) of the microsample is now aligned in the direction toward the particle source, while the original sample surface (front side) faces in the opposite direction.

Lastly, the microsample can be thinned to the desired electron transparency via backside thinning with grazing incidence of the ion beam (with respect to the lamella faces) (step S16).

However, the use of the present disclosure is not restricted to the thinning of cross-sectional lamellae. Rather, the spatial orientation of plan-view lamellae or other types of sample can also be changed.

A plan-view lamella is understood to mean a lamella which was cut out of the substrate parallel to the surface of the sample block by the focused ion beam (FIB).

After such a lamella has been thinned to the electron transparency, structures that are parallel to the sample surface can be examined by electron microscope. The method according to the disclosure also makes it possible to align extracted plan-view lamellae such that they can be thinned with grazing incidence of the ion beam (relative to the lamella face).

To this end, the lamella is attached to the TEM grid, which is in the horizontal position (i.e. at right angles to the incident particle beam 21) (FIG. 4K). Then, the lamella is transferred into the vertical position (i.e. parallel to the incident particle beam 21) by rotation about the first axis of rotation R1 (FIG. 4M) or by rotation about the second axis of rotation R2 (FIG. 4J).

It has been found to be particularly advantageous if the disclosed sample holder is used in a two-beam unit, that is to say a combined FIB-SEM unit. Using the example of a combined FIB-SEM unit 60, FIG. 8 shows such a microscope system, in which the sample holder according to the disclosure can be used and in which the method according to the disclosure can be carried out.

In order to provide a microsample 75 that is to be examined for microscopic examination or processing, the microsample 75 is held by a sample holder 74 according to the disclosure. The sample holder 74 is mounted on a sample stage 73.

The sample stage 73 is arranged in the sample chamber 69 of the combined FIB-SEM device 60, where vacuum conditions prevail during operation.

The sample stage 73 can be in the form of a multi-axis sample stage, as a result of which multiple translational and rotational degrees of freedom of movement are made available. This is the case, for example, if the sample stage 73 is in the form of a five-axis stage comprising the translational axes X, Y and Z and the axes of rotation R and T (tilt axis). In this case, the translation axes mentioned are each aligned perpendicularly in relation to one another.

The microsample 75 can thus be moved in the three spatial directions X, Y and Z by the multi-axis sample stage in order to change the location of the microsample 75. The location is understood to mean the positioning of the microsample 75 in three-dimensional space. The exact location can be described by specifying X, Y and Z coordinates.

In addition, the spatial orientation, i.e. the alignment of the microsample 75 relative to the one or more optical axes of the microscope system, can be changed by rotating and/or tilting the microsample 75 via the axes of rotation R0 and T.

The axis of rotation R0 can be aligned parallel to one of the optical axes of the microscope system when there is no rotation about the tilt axis T (i.e. when the sample stage is not tilted).

The sample stage can be in the form of a eucentric sample stage 73. This means that a sample 75 which is arranged on the sample stage 73 and located at the eucentric point can be tilted without the sample 75 moving laterally in the process. As an alternative, the sample stage may be in the form of what is referred to as a super-eucentric six-axis stage, which has an additional M axis.

The microscope system 60 comprises two particle beam columns, specifically an electron beam column 61 for generating an electron beam and an ion beam column 81 for generating an ion beam. Both particle beams are directed at the sample 75 to be processed, which can be situated at the point of coincidence of the two particle beams.

During the operation of the combined FIB-SEM unit 60, an electron source 62 generates primary electrons which are bundled, parallelized or scattered along an optical axis 64 of the electron beam column by a condenser lens system or multiple condenser lens systems 63, 65 and curtailed by at least one aperture stop 66. In addition, the electron beam column 61 comprises a deflection system 67, which makes it possible to guide the primary electron beam over the microsample 75 in the form of a raster, and an objective lens system 68, which makes it possible to focus the primary electron beam onto the microsample 75.

The combined FIB-SEM unit 60 moreover comprises an ion beam column 81 with an ion source 79, a deflection system 77, an aperture stop 82 and a lens system 76. The ion source 79 may be, for example, a liquid metal ion source (LMIS), which is operated, for example, with a gallium ion source.

The ions generated in the ion source 79 are accelerated and bundled along the optical axis 78 of the ion beam column and focused onto the microsample 75 using an objective lens system 80. The ions incident on the microsample 75 can be used to remove material from the microsample 75 and/or to image the microsample 75. The microscope system 60 can optionally also have a gas injection system 72 for introducing process gases.

The combined FIB-SEM unit 60 also comprises at least one detector 70 for detecting interaction products of the interaction of the electrons and/or ions with the microsample 75.

In addition, the microscope system 60 can comprise an evaluation and control unit 71. The evaluation and control unit 71 can execute a sequence of control commands comprised in a computer program product. Executing the control commands causes the microscope system 60 to carry out the method according to the disclosure for preparing a microscopic sample via backside thinning.

REFERENCE SIGNS

- 1 Sample block
- 2 Original sample surface
- 3 TEM lamella
- 4 Incident focused ion beam
- 5 Front side
- 6 Back side
- 7 Marking for clarifying the spatial orientation
- 8 Functional layer
- 9 First lamella face
- 10 Second lamella face
- Rv Imaginary axis of rotation (only virtual)
- x X axis
- y Y axis
- z Z axis
- 11 Base plate
- 12 Intermediate piece
- 12*a* First leg of the intermediate piece (cross-sectional view)
- 12*b* Second leg of the intermediate piece (cross-sectional view)
- 12*c* Hypotenuse of the intermediate piece (cross-sectional view)
- 13 First receiving device
- 13*a* First leg of the first receiving device (cross-sectional view)
- 13*b* Second leg of the first receiving device (cross-sectional view)
- 13 Hypotenuse of the first receiving device (cross-sectional view)
- 14 Second receiving device
- 15 TEM grid
- 16 Sample holder
- 17 First side face of the base plate
- 18 Base face of the base plate
- 19 TEM lamella
- 20 Sample stage
- 21 Particle beam
- R1 First axis of rotation
- R2 Second axis of rotation
- R3 Third axis of rotation
- α1 Angle between base face and first axis of rotation R1
- α2 Angle between the axes of rotation R1 and R2
- α3 Angle between the axes of rotation R2 and R3
- α4 Angle between base face and second axis of rotation R2
- β1 Angle of rotation about R1
- β2 Angle of rotation about R2
- β3 Angle of rotation about R3
- γ Angle between base face and first side face of the base plate
- 30 Sample holder
- 31 Base plate
- 32 Intermediate piece
- 33 First receiving device
- 34 Second receiving device
- 35 Sample carrier (TEM grid)
- 36 Microsample (TEM lamella)
- 37 Base face of the base plate
- 38 Electron beam
- α2' Angle between axis of rotation R2 and base face
- α3' Angle between the axes of rotation R1 and R2
- 40 Sample block
- 41 Functional layer
- 42 Sample substrate
- 43 Front side
- 44 Electron beam column
- 45 Optical axis of the electron beam column
- 46 Ion beam column
- 47 Optical axis of the ion beam column
- 48 Micromanipulator tip
- 50 Back side
- 51 Base plate
- 53 First receiving device
- 54 First bevel gear
- 55 Second bevel gear
- 56 Drive
- 57 First immovable axis
- 58 Second immovable axis
- 59 Microsample (TEM lamella)
- 90 Connecting element
- S1 Providing a sample block
- S2 Rotating the sample stage about the tilt axis T
- S3 Cutting out a microsample (e.g. a TEM lamella) via FIB
- S4 Rotating the sample stage back about the tilt axis T
- S5 Moving a micromanipulator tip up to the microsample
- S6 Fastening the microsample to the micromanipulator tip
- S7 Detaching the microsample from the sample block
- S8 Extracting the microsample (lift out)
- S9 Providing the extracted microsample
- S10 Providing the sample holder
- S11 Moving the microsample up to the sample carrier
- S12 Fastening the microsample to the sample carrier
- S13 Rotating the first receiving device about axis of rotation R2
- S14 Rotating the intermediate piece about axis of rotation R1
- S15 Rotating the sample stage about tilt axis T
- S16 Thinning the microsample
- 60 Microscope system (combined FIB-SEM unit, two-beam unit)
- 61 Electron beam column

62 Electron source
63 First condenser lens system
64 Optical axis of the electron beam column
65 Second condenser lens system
66 Aperture stop
67 Deflection system
68 Objective lens system (SEM)
69 Sample chamber
70 Detector
71 Evaluation and control unit
72 Gas injection system
73 Sample stage
74 Sample holder system
75 Sample
76 Lens system
77 Deflection system
78 Optical axis of the ion beam column
79 Ion source
80 Objective lens system (FIB)
81 Ion beam column
R0 Axis of rotation of the sample stage (parallel to the Z axis)
T Tilt axis of the sample stage

What is claimed is:

1. A sample holder mountable on a sample stage of a microscope system, the microscope system having an optical axis, the sample holder comprising:

a base plate comprising a base face;

a first receiving device configured to receive a microsample; and an intermediate piece between the base plate and the first receiving device, wherein:

the intermediate piece is rotatably connected to the base plate so that the intermediate piece is rotatable relative to the base plate about a first axis of rotation;

the sample holder is configured so that rotating the intermediate piece about the first axis of rotation transfers the intermediate piece between a first alignment of the intermediate piece relative to the optical axis and a second alignment of the intermediate piece relative to the optical axis;

the first axis of rotation is aligned relative to the base face at an angle of 45°;

the first receiving device is rotatably connected to the intermediate piece so that the first receiving device is rotatable relative to the intermediate piece about a second axis of rotation;

the sample holder is configured so that rotating the first receiving device about the second axis of rotation transfers the first receiving device between a first alignment of the first receiving device relative to the optical axis and a second alignment of the first receiving device relative to the optical axis;

the second axis of rotation is aligned relative to the first axis of rotation at an angle of (90+x)°; and x is from 0° to 20°.

2. The sample holder of claim 1, wherein x is 2°.

3. The sample holder of claim 1, wherein:

x is 0°; and the first axis of rotation and the second axis of rotation are at right angles to one another.

4. The sample holder of claim 1, further comprising a second receiving device connected to the first receiving device, wherein the second receiving device is configured to receive the microsample.

5. The sample holder of claim 4, wherein the sample holder has a third axis of rotation about which the second receiving device is rotatable relative to the first receiving device.

6. The sample holder of claim 4, further comprising a sample carrier configured to receive the microsample on the first receiving device or the second receiving device.

7. The sample holder of claim 6, further comprising multiple sample carriers configured to receive microsamples.

8. The sample holder of claim 1, further comprising a sample carrier configured to receive the microsample on the first receiving device.

9. The sample holder of claim 8, further comprising multiple sample carriers configured to receive microsamples.

10. The sample holder of claim 1, wherein the intermediate piece has a triangular profile, and the first receiving device has a triangular profile.

11. The sample holder of claim 10, wherein x is 2°.

12. The sample holder of claim 10, wherein:

x is 0°; and the first axis of rotation and the second axis of rotation are at right angles to one another.

13. A microscope system having an optical axis, the microscope system comprising:

a sample stage; and a sample holder mounted on the sample stage, the sample holder comprising:

a base plate comprising a base face;

a first receiving device configured to receive a microsample; and an intermediate piece between the base plate and the first receiving device, wherein:

the intermediate piece is rotatably connected to the base plate so that the intermediate piece is rotatable relative to the base plate about a first axis of rotation;

the sample holder is configured so that rotating the intermediate piece about the first axis of rotation transfers the intermediate piece between a first alignment of the intermediate piece relative to the optical axis and a second alignment of the intermediate piece relative to the optical axis;

the first axis of rotation is aligned relative to the base face at an angle of 45°;

the first receiving device is rotatably connected to the intermediate piece so that the first receiving device is rotatable relative to the intermediate piece about a second axis of rotation;

the sample holder is configured so that rotating the first receiving device about the second axis of rotation transfers the first receiving device between a first alignment of the first receiving device relative to the optical axis and a second alignment of the first receiving device relative to the optical axis;

the second axis of rotation is aligned relative to the first axis of rotation at an angle of (90+x)°; and x is from 0° to 20°.

14. The microscope system of claim 13, further comprising a particle beam unit.

15. One or more machine-readable hardware storage devices comprising instructions that are executable by one or more processing devices to perform operations comprising the method of claim 14.

16. A system comprising:

one or more processing devices; and one or more machine-readable hardware storage devices comprising instructions that are executable by the one or more processing devices to perform operations comprising the method of claim 14.

17. The microscope system of claim 13, further comprising:

an ion beam column configured to generate a focused ion beam; and an electron beam column configured to generate an electron beam.

18. A method of preparing a microsample via backside thinning, the method to be performed using a microscope system which comprises an electron beam column configured to generate an electron beam and an ion beam column configured to generate a focused ion beam, the electron beam column and the ion beam column each having an optical axis, the microscope system further comprising a tiltable sample stage rotatable about a tilt axis, the method comprising:

providing an extracted microsample that was processed using the focused ion beam, the microsample having a front side that faced toward the ion beam during the processing, the microsample having back side opposite the front side;

providing a sample holder a sample holder mounted on the tiltable sample stage, the sample holder comprising: a base plate comprising a base face; a first receiving device configured to receive a microsample; and an intermediate piece between the base plate and the first receiving device, wherein: the intermediate piece is rotatably connected to the base plate so that the intermediate piece is rotatable relative to the base plate about a first axis of rotation; the sample holder is configured so that rotating the intermediate piece about the first axis of rotation transfers the intermediate piece between a first alignment of the intermediate piece relative to the optical axis and a second alignment of the intermediate piece relative to the optical axis; the first axis of rotation is aligned relative to the base face at an angle of 45°; the first receiving device is rotatably connected to the intermediate piece so that the first receiving device is rotatable relative to the intermediate piece about a second axis of rotation; the sample holder is configured so that rotating the first receiving device about the second axis of rotation transfers the first receiving device between a first alignment of the first receiving device relative to the optical axis and a second alignment of the first receiving device relative to the optical axis; the second axis of rotation is aligned relative to the first axis of rotation at an angle of (90+x)°; x is from 0° to 20°; the intermediate piece is in its first alignment; and the first receiving device of the sample holder is in its first alignment;

moving the microsample up to a sample carrier;

fastening the microsample to the sample carrier;

rotating the first receiving device about the second axis of rotation until the first receiving device is aligned in its second alignment;

rotating the intermediate piece about the first axis of rotation until the intermediate piece is aligned in its second alignment;

rotating the sample stage about the tilt axis until lamella faces of the microsample are aligned parallel to the optical axis of the ion beam column; and thinning the microsample via the focused ion beam, the ion beam being substantially perpendicularly incident on the back side of the microsample.

19. The method of claim 18, further comprising:

rotating the first receiving device about the second axis of rotation by 180° during the rotating operation to transfer the first receiving device from the first alignment to the second alignment; and rotating the intermediate piece about the first axis of rotation by 180° during the rotating operation to transfer the intermediate piece from the first alignment to the second alignment.

20. The method of claim 18, further comprising:

providing a sample block comprising a sample surface;

rotating the sample stage about the tilt axis so that the ion beam is perpendicularly incident on the sample surface;

cutting the microsample out of the sample block via the ion beam;

rotating the sample stage back about the tilt axis and cutting a bottom edge via the ion beam;

fastening a micromanipulator tip to the microsample and severing the connection between the microsample and the sample block; and extracting the microsample.

* * * * *